United States Patent
Okamoto et al.

(10) Patent No.: US 7,256,432 B2
(45) Date of Patent: Aug. 14, 2007

(54) FIELD-EFFECT TRANSISTOR

(75) Inventors: Yasuhiro Okamoto, Tokyo (JP); Hironobu Miyamoto, Tokyo (JP); Yuji Ando, Tokyo (JP); Tatsuo Nakayama, Tokyo (JP); Takashi Inoue, Tokyo (JP); Masaaki Kuzuhara, Tokyo (JP)

(73) Assignee: NEC Corporation, Tokyo (JP)

( * ) Notice: Subject to any disclaimer, the term of this patent is extended or adjusted under 35 U.S.C. 154(b) by 210 days.

(21) Appl. No.: 10/541,583

(22) PCT Filed: Dec. 15, 2003

(86) PCT No.: PCT/JP03/16033

§ 371 (c)(1),
(2), (4) Date: Jul. 7, 2005

(87) PCT Pub. No.: WO2004/061978

PCT Pub. Date: Jul. 22, 2004

(65) Prior Publication Data

US 2006/0043415 A1    Mar. 2, 2006

(30) Foreign Application Priority Data

Jan. 7, 2003    (JP)    ............... 2003-000842

(51) Int. Cl.
  *H01L 29/205*    (2006.01)
  *H01L 29/78*    (2006.01)
(52) U.S. Cl. .............. 257/192; 257/200; 257/201; 257/E29.091; 257/E29.255; 257/E29.264
(58) Field of Classification Search ........ 257/192, 257/200, 201, E29.091, E29.255, E29.264
See application file for complete search history.

(56) References Cited

U.S. PATENT DOCUMENTS

| | | | | |
|---|---|---|---|---|
| 5,111,256 A | * | 5/1992 | Ohata et al. ............. | 257/192 |
| 6,933,544 B2 | * | 8/2005 | Saito et al. ............. | 257/194 |
| 7,173,307 B2 | * | 2/2007 | Hayashi et al. .......... | 257/330 |
| 2001/0015446 A1 | * | 8/2001 | Inoue et al. ............. | 257/192 |

FOREIGN PATENT DOCUMENTS

| | | |
|---|---|---|
| JP | 11-176839 | 7/1999 |
| JP | 2000-003919 | 1/2000 |
| JP | 2000-286428 | 10/2000 |
| JP | 2001-189324 | 7/2001 |
| JP | 2002-222860 | 8/2002 |
| JP | 2002-359256 | 12/2002 |

OTHER PUBLICATIONS

U. K. Mishra et al., "AlGaN/GaN HEMTs-An Overview of Device Operation and Applications", Proceedings of the IEEE, vol. 90, No. 6, Jun. 2002.
J. Li et al., "High Breakdown voltage GaN HFET with field plate", Electronics Letters, 1st Feb. 2001, vol. 37, No. 3.
Y. Ando et al., "A 110-W AlGaN/GaN Heterojunction FET on Thinned Sapphire Substrate".

* cited by examiner

*Primary Examiner*—Evan Pert
*Assistant Examiner*—Victor A. Mandala, Jr.
(74) *Attorney, Agent, or Firm*—Young & Thompson

(57) ABSTRACT

An electric-field control electrode (5) is formed between a gate electrode (2) and a drain electrode (3). A multilayered film including a SiN film (21) and a SiO₂ film (22) is formed below the electric-field control electrode (5). The SiN film (21) is formed so that a surface of an AlGaN electron supply layer (13) is covered with the SiN film (21).

20 Claims, 27 Drawing Sheets

(a)

(b)

(a)

(b)

(c)

(d)

(e)

(f)

(a)

(b)

(c)

(d)

(e)

(f)

(g)

(h)

○ WITH ELECTRIC-FIELD CONTROL ELECTRODE
    (FIXED AT 0V)
△ WITHOUT ELECTRIC-FIELD CONTROL ELECTRODE

INSULATING FILM : SINGLE-LAYER OF SiN

SIZE OF ELECTRIC-FIELD CONTROL ELECTRODE : 0.5 μm

DISTANCE BETWEEN GATE ELECTRODE
AND ELECTRIC-FIELD CONTROL ELECTRODE : 0.5 μm

INSULATING FILM : SINGLE-LAYER OF SiN

SIZE OF ELECTRIC-FIELD CONTROL ELECTRODE : 1.0μm

DISTANCE BETWEEN GATE ELECTRODE
AND ELECTRIC-FIELD CONTROL ELECTRODE : 0.5μm

INSULATING FILM : SINGLE-LAYER OF SiN

FIELD PLATE LENGTH : 1 μm

SIZE OF ELECTRIC-FIELD CONTROL ELECTRODE : 0.5 μm

DISTANCE BETWEEN GATE ELECTRODE
AND ELECTRIC-FIELD CONTROL ELECTRODE : 0.5 μm

US 7,256,432 B2

FIELD-EFFECT TRANSISTOR

FIELD OF THE INVENTION

The present invention relates to a field-effect transistor in which a Group III nitride semiconductor is used.

DESCRIPTION OF THE RELATED ART

Group III nitride semiconductors including GaN have a large band gap, a high dielectric breakdown electric field, and high electron saturation drift velocity. Further, because two-dimensional carrier gas can be utilized by a heterojunction, the Group III nitride semiconductors are expected as a material for realizing an electronic element which is excellent for high-temperature operation, high-speed switching operation, large-power operation, and the like.

In the transistor in which the Group III nitride semiconductor is used, the large amount of negative charge is generated in the substrate surface, which largely affects transistor performance. This respect will be described below.

When AlGaN is grown on undoped GaN, a positive fixed charge is generated in a hetero-interface by actions of both spontaneous polarization and piezo polarization. At this point, a negative polarization charge is generated in the AlGaN surface. Polarization charge density is changed by AlGaN composition. Extremely large sheet electron density having an order of $1 \times 10^{13}/cm^2$ is generated in an AlGaN/GaN heterostructure. This phenomenon is explained in detail, e.g., in Non-Patent Reference 1. When ohmic electrodes are formed in the heterostructure to apply the electric field between the electrodes, current is passed based on charge transport of the high electron density having the order of $1 \times 10^{13}/cm^2$. Thus, unlike a GaAs semiconductor FET driven by a carrier generated by impurity doping, the Group III nitride semiconductor element is operated by the high-density carrier generated by the actions of both the spontaneous polarization and the piezo polarization.

In the Group III nitride semiconductor transistor operated by the above-described mechanism, it is demanded that a breakdown voltage is increased while a gain is kept good. The following technologies are well known as a method of improving the breakdown voltage.

Non-Patent Reference 2 describes a structure, in which a visor-shaped field plate is provided on a drain side of a gate electrode and a SiN film is arranged below the field plate. FIG. 18 shows a schematic structure of HJFET described in Non-Patent Reference 2. HJFET is formed on a SiC substrate 110. A buffer layer 111 including a semiconductor layer is formed on the SiC substrate 110. A GaN channel layer 112 is formed on the buffer layer 111. An AlGaN electron supply layer 113 is formed on the channel layer. A source electrode 101 and a drain electrode 103, in which ohmic contact is secured, are located on the electron supply layer. A gate electrode 102, in which Schottky contact is secured, and a field plate portion 105 are located between the source electrode 101 and the drain electrode 103. A surface of the AlGaN electron supply layer 113 is covered with a SiN film 121, and the SiN film 121 is arranged immediately below the field plate portion 105. According to Non-Patent Reference 2, the breakdown voltage is improved by adopting the above structure.

Patent Reference 1 discloses the technology in which an electric-field control electrode is provided between a gate electrode and a drain electrode in GaAs semiconductor elements. According to Patent Reference 1, electric field concentration is relaxed in a drain side end portion of the gate electrode and element performance is improved.

These technologies are effective from the viewpoint of improving the transistor breakdown voltage. However, in designing the Group III nitride semiconductor element including the heterojunction, such improvements alone are not always sufficient. In the Group III nitride semiconductor element, as carrier gas is generated in the heterojunction portion, the negative charge is induced in the surface of the semiconductor layer structure, which largely affects respective characteristics of a transistor. Therefore, it is necessary that both the improvement of the breakdown voltage and the control technology of the surface negative charge are integrally studied. This respect will be described below.

In the laminated structure of the Group III nitride semiconductor including the heterojunction, it is known that the negative charge is generated in the semiconductor layer surface of AlGaN and like while the large amount of charge is generated in a channel layer by the piezo polarization and the like (Non-Patent Reference 1). The negative charge acts directly on drain current to strongly affect the element performance. Specifically, when the large negative charge is generated in the surface, the maximum drain current during alternating current operation is deteriorated compared with direct current operation. Hereinafter, this phenomenon is referred to as collapse. The phenomenon is remarkably generated in elements in which the Group III nitride semiconductor is used, and the phenomenon does not become obvious in the GaAs semiconductor elements. This is because the extremely small amount of the polarization charge is generated in the AlGaAs/GaAs heterojunction.

In order to solve the above problems, conventionally a surface protection film made of SiN is formed. However, in a structure in which SiN is not provided, because the sufficient current is not obtained in applying high voltage, it is difficult to obtain a merit that GaN semiconductor material is used. In consideration of such situations, there is a common perception that the provision of the SiN film on the surface is required in the field of the Group III nitride semiconductor FET, and it becomes technical common sense. An example of the conventional transistors will be described below.

FIG. 17 is a drawing of a sectional structure of a heterojunction field-effect transistor (hereinafter referred to as HJFET) by the conventional art. For example, the conventional HJFET is described in Non-Patent Reference 3. An AlN buffer layer 111, a GaN channel layer 112, and an AlGaN electron supply layer 113 are sequentially laminated on a sapphire substrate 109 in the conventional HJFET. A source electrode 101 and a drain electrode 103 are formed on the multilayered film, and these electrodes are in ohmic contact with the AlGaN electron supply layer 113. A gate electrode 102 is formed between the source electrode 101 and the drain electrode 103, and the gate electrode 102 is in contact with the AlGaN electron supply layer 113 in a Schottky contact manner. A SiN film 121 is formed as a surface protection film in the uppermost layer.

Non-Patent Reference 1: U. K. Mishra, P. Parikh, and Yi-Feng Wu, "AlGaN/GaN HEMTs—An overview of device operation and applications," Proc. IEEE, vol. 90, No. 6, pp. 1022-1031, 2002

Non-Patent Reference 2: Li et al., Electronics Letters vol. 37 p. 196-197, 2001

Non-Patent Reference 3: Y. Ando, International Electron Device Meeting Digest (IEDM01-381 to 384), 2001

Patent Reference 1: Japanese Patent Application Laid-Open No. 2000-3919

SUMMARY OF THE INVENTION

However, in the structure in which SiN is provided, the gate breakdown voltage is decreased while the collapse is improved. Namely, there is a trade-off between the amount of collapse and the gate breakdown voltage, and the control becomes extremely difficult. FIG. 19 shows an evaluation result of a relationship among a thickness of the surface protection film SiN, the amount of collapse, and the gate breakdown voltage, which was obtained by using a prototype of HJFET having the structure of FIG. 17 in which the electric-field control electrode is not provided. In FIG. 19, a round mark corresponds to the collapse, and a triangle mark corresponds to the gate breakdown voltage.

When the SiN film is formed on the element surface in which the collapse is remarkably generated, the amount of collapse can be decreased. Referring to FIG. 19, the amount of collapse is not lower than 60%, when the SiN film does not exist (film thickness of 0 nm). On the other hand, when the SiN film thickness is set at 100 nm, the amount of collapse can be suppressed to values not more than 10%. Thus, in order to sufficiently suppress the collapse, it is necessary that the thickness of the SiN film is set at a certain degree. However, when the SiN film is thickened, the surface negative charge is eliminated and the electric field concentration becomes remarkable between the gate and the drain, which results in the decrease in gate breakdown voltage. Namely, there is the trade-off between the collapse and the gate breakdown voltage.

In addition, when the SiN film is thickened in order to sufficiently decrease the collapse, reliability is decreased by aged deterioration in film quality of an insulating film located immediately below the electric-field control electrode. Namely, there is also the trade-off between the collapse and the reliability.

Thus, the plural trade-offs exist in the GaN HJFETs in which the SiN film is used as the protection film, and each balance of the trade-offs is determined according to the difference in SiN film thickness. The trade-offs are caused by the surface negative charge which is unique to the Group III nitride semiconductor element having a hetero-interface. Therefore, in designing the Group III nitride semiconductor element, it is necessary to give sufficient consideration to handling the surface negative charge.

In the case where a $SiO_2$ film is used as the protection film instead of the SiN film, a relationship between the collapse and the gate breakdown voltage is shown in FIG. 20 (the relationship shown in FIG. 20 is obtained from the structure in which the electric-field control electrode is not provided as in FIG. 17). Although the film thickness dependence is absent, as with the use of the SiN film, it is difficult to maintain the compatibility between the collapse and the gate breakdown voltage.

Thus, due to the circumstances unique to HJFET made of the Group III nitride semiconductor including GaN, in studying the performance improvement of the element, the study is required from the viewpoints different from the design of the GaAs semiconductor elements.

In view of the foregoing, an object of the invention is to provide a transistor which is excellent for the balance between the collapse and the gate breakdown voltage. Another object of the invention is to provide a transistor which is excellent for the reliability and high-frequency properties in addition to the performance balance between the collapse and the gate breakdown voltage.

The negative polarization charge generated in the AlGaN surface largely affects the FET characteristics depending on electric properties of the protection film (passivation film) deposited on AlGaN. Usually, when the large negative fixed charge exists on the surface, although the large gate breakdown voltage is obtained, the maximum drain current during alternating current operation tends to be deteriorated compared with direct current operation. On the other hand, when the amount of negative charge is small in the surface, although the gate breakdown voltage is small, the deterioration in maximum drain current is also small. The operation of FET is usually dominated by the trade-off relationship. In the AlGaN/GaN heterostructure, since the negative charge having the order of $1 \times 10^{13}/cm^2$ is generated in the surface, the trade-off relationship extremely remarkably appears depending on the quality of the surface passivation. The breakdown voltage value is frequently changed to at least one digit larger or smaller value. Such large changes do not appear in GaAs FETs. In other words, GaN FETs are the device which is very sensitive to the surface state. In order to stably obtain the high performance with high yield with respect to the electric properties of GaN FETs, it is necessary to pay utmost attention to the control of the surface passivation film.

From the above points of view, the inventor studied and found that the protection film immediately below the electric-field control electrode is formed by a specific material and a specific layer structure while the element electrode structure including the electric-field control electrode is formed, thereby the performance balance in the trade-off can effectively be improved by synergistic action between the gate electrode structure and the specific material and specific layer structure. Further, the inventor found that, because the electric-field control electrode can independently be controlled in the structure of the invention, the excellent transistor in which not only the collapse can effectively be decreased but also the decrease in gain can also be suppressed can be realized. The invention was made based on the new findings.

Then, structures of the invention will be described.

According to the invention, there is provided a field-effect transistor comprising a Group III nitride semiconductor layer structure which includes a heterojunction; a source electrode and a drain electrode which are formed on the semiconductor layer structure while being separated from each other; and a gate electrode which is arranged between the source electrode and the drain electrode, wherein, an electric-field control electrode is formed through an insulating film in an upper portion of the Group III nitride semiconductor layer structure, the electric-field control electrode being located in an area between the gate electrode and the drain electrode, and the insulating film is a multilayered film including a first insulating film and a second insulating film, the first insulating film containing silicon and nitrogen as constituent elements, the second insulating film having a dielectric constant lower than that of the first insulating film.

The present invention has a structure in which the multilayered film having the above configuration is formed between the electric-field control electrode and the surface of the semiconductor layer structure while the electric-field control electrode is provided, which generates synergistic action resulting in remarkable improvement of a balance between the collapse and the gate breakdown voltage. Further, even if a surface state is fluctuated by variations in a manufacturing process, good performance can stably be realized.

In the invention, while the first insulating film is provided in order to decrease an influence of the surface negative charge, the second insulating film is provided in order to decrease the capacity immediately below the electric-field control electrode. Namely, while the influence of the surface negative charge is decreased by the action of the first insulating film, the gate breakdown voltage is improved by the second insulating film, such as the film not containing nitrogen, having the dielectric constant lower than that of the first insulating film. Further, the aged deterioration in quality of the insulating film and the increase in capacity can effectively be suppressed in an area below the electric-field control electrode, and the transistor which is excellent for the reliability and the high-frequency gain can be obtained.

In this case, it is possible that the first insulating film is formed while being in contact with the surface of the Group III nitride semiconductor layer structure and the second insulating film is laminated on the first insulating film. Therefore, the collapse is remarkably improved. The first insulating film is not more than 150 nm, and preferably the first insulating film is not more than 100 nm. Therefore, the capacity below the electric-field control electrode can securely be decreased, and the high-frequency gain can be improved.

In the present invention, it is also possible that a dielectric constant of the second insulating film is not more than 3.5. Therefore, the capacity below the electric-field control electrode can be decreased and the gain can further be improved.

In the present invention, it is also possible that a third insulating film which contains silicon and nitrogen as constituent elements is further provided on the second insulating film. The uppermost layer of the insulating film is formed by a compound including silicon and nitrogen as constituent elements, which obtains such advantages that the resist is stably formed with ease in the process of manufacturing the element. As a result, a yield can be increased in manufacturing the transistor whose performance is improved in the above-described manner.

In the present invention, it is possible that the insulating film including the multilayered film having the first insulating film and the second insulating film is provided while being separated from the gate electrode, and the second insulating film is provided between the insulating film and the gate electrode. Therefore, the performance balance between the collapse and the gate breakdown voltage is improved more remarkably.

According to the present invention, there is provided a field-effect transistor comprising a Group III nitride semiconductor layer structure which includes a heterojunction; a source electrode and a drain electrode which are formed on the semiconductor layer structure while being separated from each other; and a gate electrode which is arranged between the source electrode and the drain electrode, wherein, an electric-field control electrode is formed through an insulating film in an upper portion of the Group III nitride semiconductor layer structure, the electric-field control electrode being located in an area between the gate electrode and the drain electrode, and the insulating film contains silicon and nitrogen as constituent elements.

According to the present invention, there is provided a field-effect transistor comprising a Group III nitride semiconductor layer structure which includes a heterojunction; a source electrode and a drain electrode which are formed on the semiconductor layer structure while being separated from each other; and a gate electrode which is arranged between the source electrode and the drain electrode, wherein, an electric-field control electrode is formed through an insulating film in an upper portion of the Group III nitride semiconductor layer structure, the electric-field control electrode being located in an area between the gate electrode and the drain electrode, and the insulating film is an insulating film which contains silicon, oxygen, and carbon as constituent elements.

According to the present invention, the balance between the collapse and the gate breakdown voltage can remarkably be improved by the synergistic action between the electric-field control electrode and the insulating film below the electric-field control electrode.

It is possible that the above-described compound further contains oxygen, carbon, and the like as constituent elements. Therefore, since the insulating film material contains oxygen and carbon as constituent elements in addition to silicon and nitrogen, the internal stress is remarkably decreased in the film when compared with SiN and the like. Accordingly, while the relatively good collapse and gate breakdown voltage can be realized, the deterioration in film quality of the insulating film located immediately below the electric-field control electrode can effectively be suppressed. Further, when compared with SiN, the dielectric constant is decreased, so that the capacity generated in the area below the electric-field control electrode can be decreased. Thus, according to the invention, the transistor which is excellent for the reliability and the high-frequency gain can be obtained.

According to the present invention, there is provided a field-effect transistor comprising a Group III nitride semiconductor layer structure which includes a heterojunction; a source electrode and a drain electrode which are formed on the semiconductor layer structure while being separated from each other; and a gate electrode which is arranged between the source electrode and the drain electrode, wherein, an electric-field control electrode is formed through an insulating film in an upper portion of the Group III nitride semiconductor layer structure, the electric-field control electrode being located in an area between the gate electrode and the drain electrode, the insulating film on the gate electrode side is formed by an insulating material which does not contain nitrogen as a constituent element, and the insulating film on the drain electrode side is formed by an insulating material which contains silicon and nitrogen as constituent elements.

In the field-effect transistor, it is possible that the insulating material provided on the drain electrode side, of the insulating film further contains oxygen and/or carbon as a constituent element in addition to silicon and nitrogen.

According to the present invention, the insulating film which contains no nitride and which has the relatively low dielectric constant is formed on the gate electrode side, so that the capacity formed by the electric-field control electrode, the semiconductor layer structure, and the insulating film therebetween can be decreased. As a result, the transistor which is excellent for the gate breakdown voltage and performance balance between the reliability and the high-frequency gain can be obtained. The compound, such as SiN, containing silicon, nitrogen, and oxygen as constituent elements is formed on the drain electrode side, so that the decrease in performance caused by the surface negative charge can be reduced.

According to the present invention, there is provided a field-effect transistor comprising a Group III nitride semiconductor layer structure which includes a heterojunction; a source electrode and a drain electrode which are formed on the semiconductor layer structure while being separated from each other; and a gate electrode which is arranged between the source electrode and the drain electrode, wherein, an electric-field control electrode is formed through an insulating film in an upper portion of the Group III nitride semiconductor layer structure, the electric-field control electrode being located in an area between the gate electrode and the drain electrode, and a dielectric constant of the insulating film is not more than 3.5.

The present invention has a structure in which the low-dielectric-constant film having the above configuration is formed between the electric-field control electrode and the surface of the semiconductor layer structure while the electric-field control electrode is provided. The low-dielectric-constant film is formed in the area immediately below the electric-field control electrode, which allows the high voltage to be avoided from applying to the insulating film located in the area. Therefore, the aged deterioration in quality of the insulating film below the electric-field control electrode can effectively be suppressed to remarkably improve the reliability of the element. Further, the capacity formed by the electric-field control electrode, the semiconductor layer structure, and the insulating film therebetween can be decreased by utilizing the low-dielectric-constant film, so that the high-frequency gain can also be improved. As a result, according to the present invention, the transistor which is excellent for the gate breakdown voltage and the performance balance between the reliability and the high-frequency gain can be obtained. In the insulating film having the dielectric constants not more than 3.5, it is possible that the insulating film is formed by either a single-layer film or a multilayered film as long as an average value of the dielectric constants is not more than 3.5.

Thus, the structures of the transistor according to the present invention have been described. Further, in the structures, it is also possible that the following structures are combined.

It is possible that the Group III nitride semiconductor layer structure includes a channel layer made of $In_xGa_{1-x}N$ ($0 \leq x \leq 1$) and an electron supply layer made of $Al_yGa_{1-y}N$ ($0 < y \leq 1$). The lamination order of the channel layer and the electron supply layer is arbitrarily determined. In the semiconductor layer structure, it is possible that an intermediate layer and a cap layer are provided in the semiconductor layer structure as appropriate.

It is also possible to form a structure in which contact layers are arranged between the source electrode and a surface of the Group III nitride semiconductor layer structure and between the drain electrode and the surface of the Group III nitride semiconductor layer structure, respectively. The structure including the contact layer is referred to as a wide recess structure. When the wide recess structure is adopted, the electric field concentration can further effectively be dispersed and relaxed in the drain side end portion of the gate electrode by the synergistic action between the electric-field control electrode and the insulating film structure immediately below the electric-field control electrode. In the recess structure, it is also possible to form a multi-step recess. In this case, it is possible that the electric-field control electrode extends to an upper portion of the contact layer. Therefore, the electric field concentration can be relaxed on the drain side. When the electric-field control electrode extends as described above, the electric field concentration becomes the problem in the drain electrode end portion due to the overlap between the electric-field control electrode and the drain electrode. However, the presence of the contact layer reduces the problem. At this point, the electric field concentration can remarkably be reduced in the drain electrode end portion, when the contact layer is formed by an undoped AlGaN layer, i.e., the AlGaN layer in which the intentional doping is not performed.

Further, it is also possible that the Group III nitride semiconductor layer structure has a structure in which the channel layer made of $In_xGa_{1-x}N$ ($0 \leq x \leq 1$), the electron supply layer made of $Al_yGa_{1-y}N$ ($0 < y \leq 1$), and the cap layer made of GaN are sequentially laminated. Therefore, the effective Schottky height can be increased to realize the higher gate breakdown voltage. Namely, the further excellent gate breakdown voltage can be obtained by the synergistic action among the electric-field control electrode, the multilayered film immediately below the electric-field control electrode, and the GaN cap layer according to Example.

It is also possible that a distance between the gate electrode and the drain electrode is formed longer than a distance between the gate electrode and the source electrode. It is also referred to as off-set structure, which effectively disperses and relaxes the electric field concentration in the drain side end portion of the gate electrode. Further, in the production, there is the advantage that the electric-field control electrode is easy to form.

In the present invention, it is possible that the electric-field control electrode can be controlled independently of the gate electrode. Namely, different potentials can be given to the electric-field control electrode and the gate electrode, respectively. Therefore, the field-effect transistor can be driven on the optimum condition.

As described above, in the field-effect transistor of the present invention, the suppression of the collapse and the higher gate breakdown voltage can simultaneously be realized. Accordingly, the output properties can be largely improved during the large signal operation with the high voltage.

BRIEF DESCRIPTION OF THE DRAWINGS

The above and other objects, features, and advantages will become more apparent from the following preferred embodiments and accompanying drawings therewith.

DETAILED DESCRIPTION OF THE INVENTION

Embodiments of the invention will be described below by Examples. In the following Examples, a c-surface SiC is used as a growth substrate of the Group III nitride semiconductor layer.

EXAMPLE 1

Figure 1:
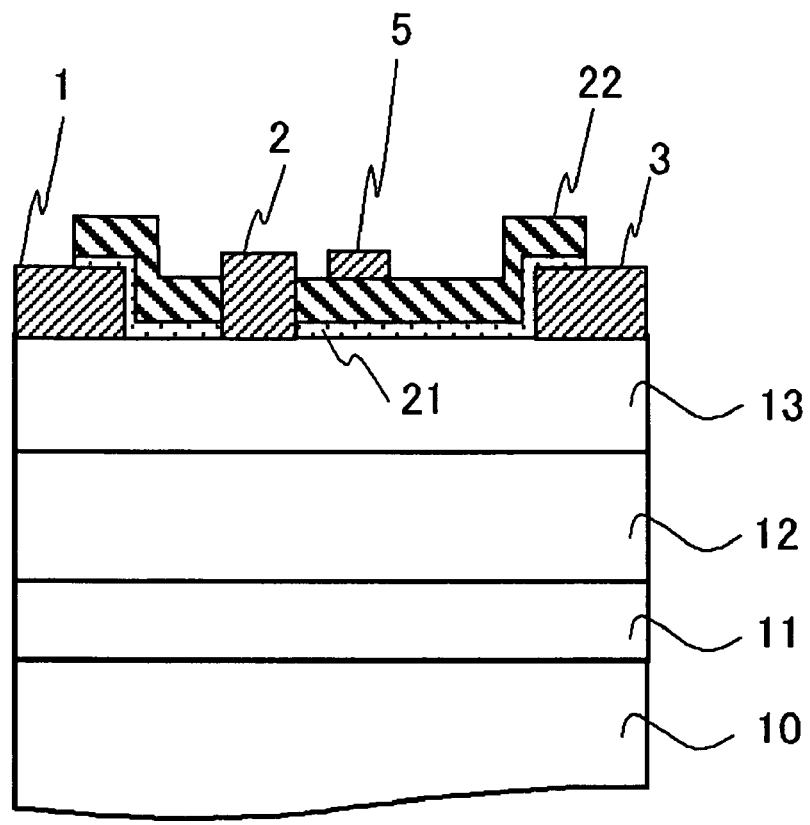
FIG. 1 is a view showing a transistor structure according to Example.

FIG. 1 shows a sectional structure of HJFET in Example 1. HJFET is formed on a substrate 10 made of a material such as SiC. A buffer layer 11 including a semiconductor layer is formed on the substrate 10. A GaN channel layer 12 is formed on the buffer layer 11. An AlGaN electron supply layer 13 is formed on the channel layer. A source electrode 1 and a drain electrode 3, in which ohmic contact is secured, are formed on the electron supply layer. A gate electrode 2, in which Schottky contact is secured, and an electric-field control electrode 5 are provided between the source electrode 1 and the drain electrode 3. A surface of the electron supply layer 13 is covered with a SiN film 21, and a $SiO_2$ film 22 is further provided on the SiN film 21. The SiN film 21 and the $SiO_2$ film 22 are provided immediately below the electric-field control electrode 5.

Figure 21:
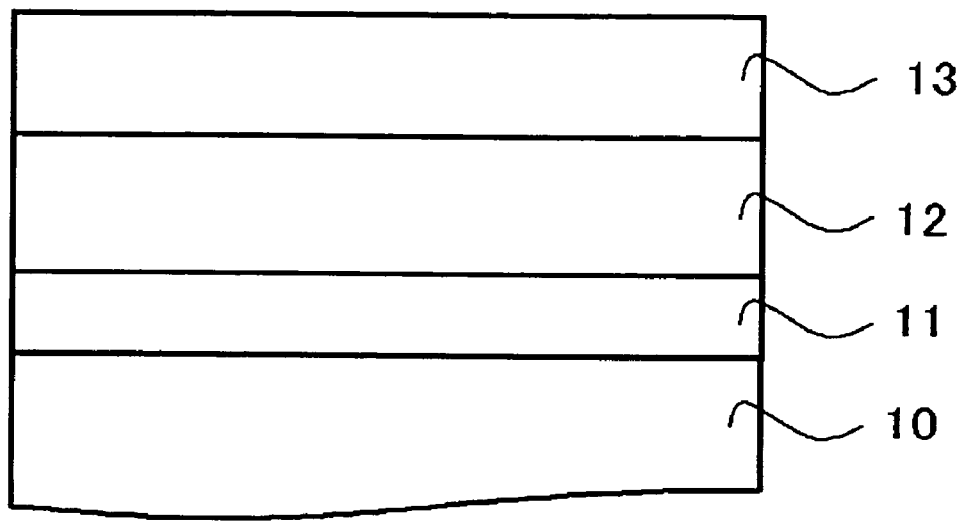
FIG. 21 is a view showing a method of manufacturing a transistor according to Example.
Figure 21:
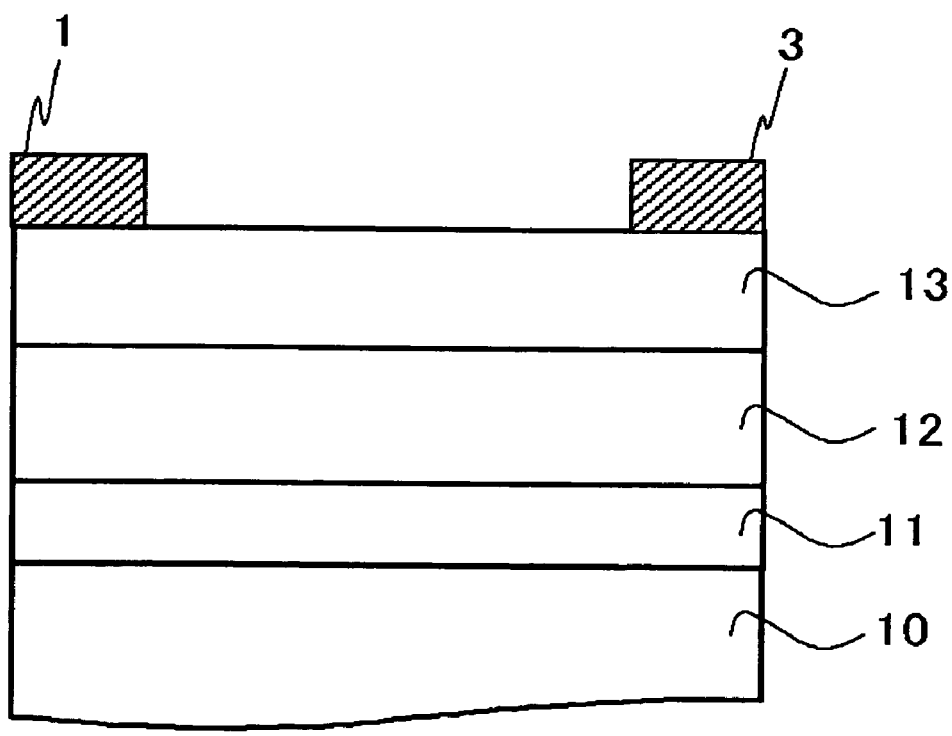
Figure 22:
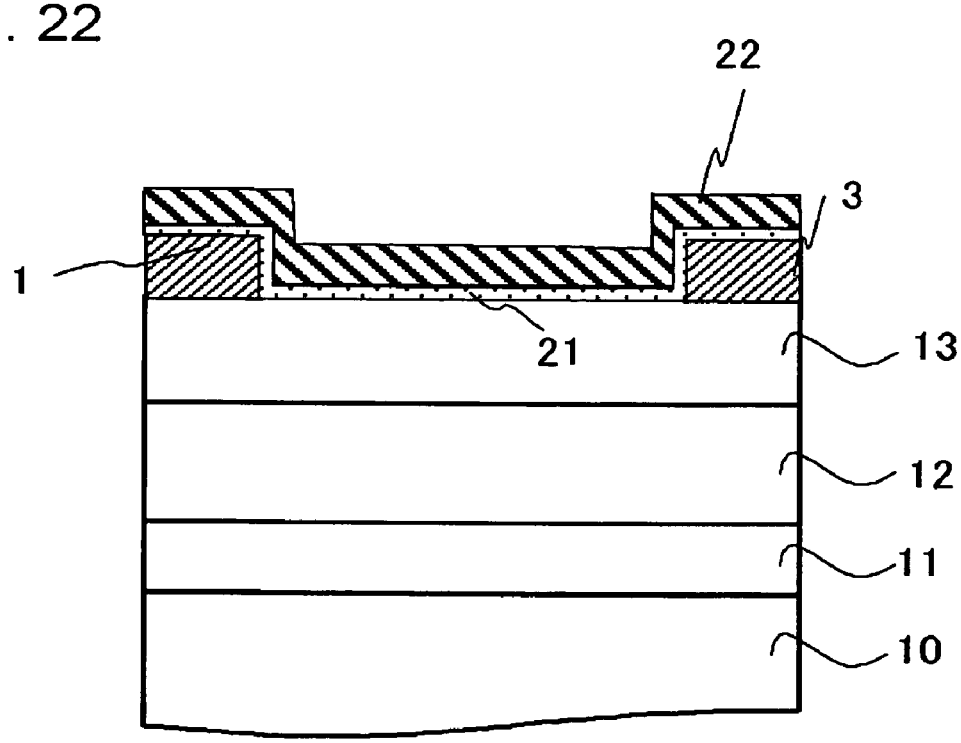
FIG. 22 is a view showing a method of manufacturing a transistor according to Example.
Figure 22:
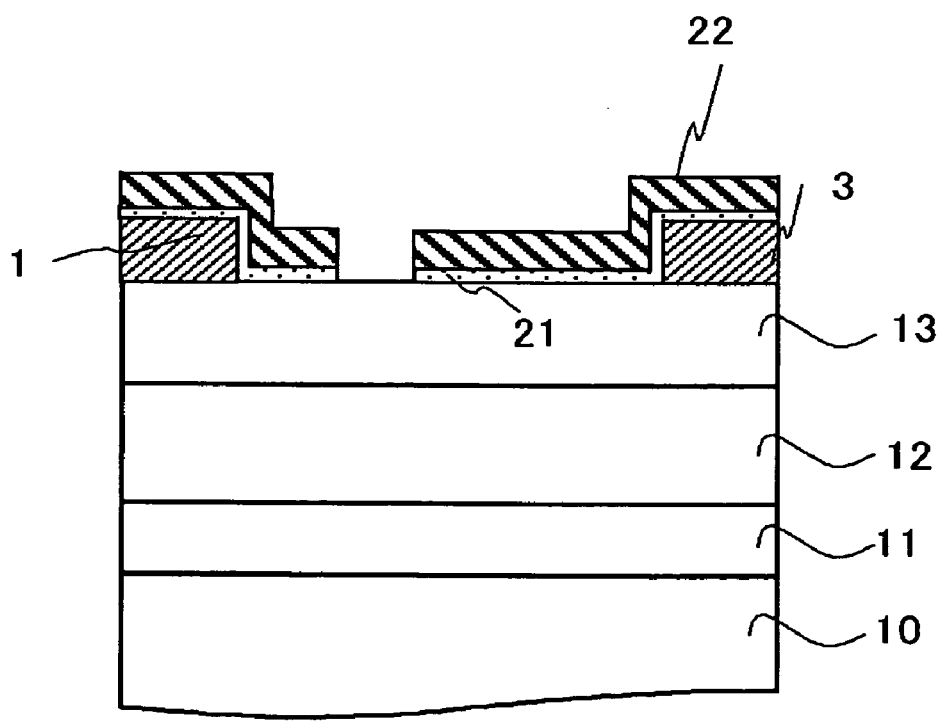
Figure 23:
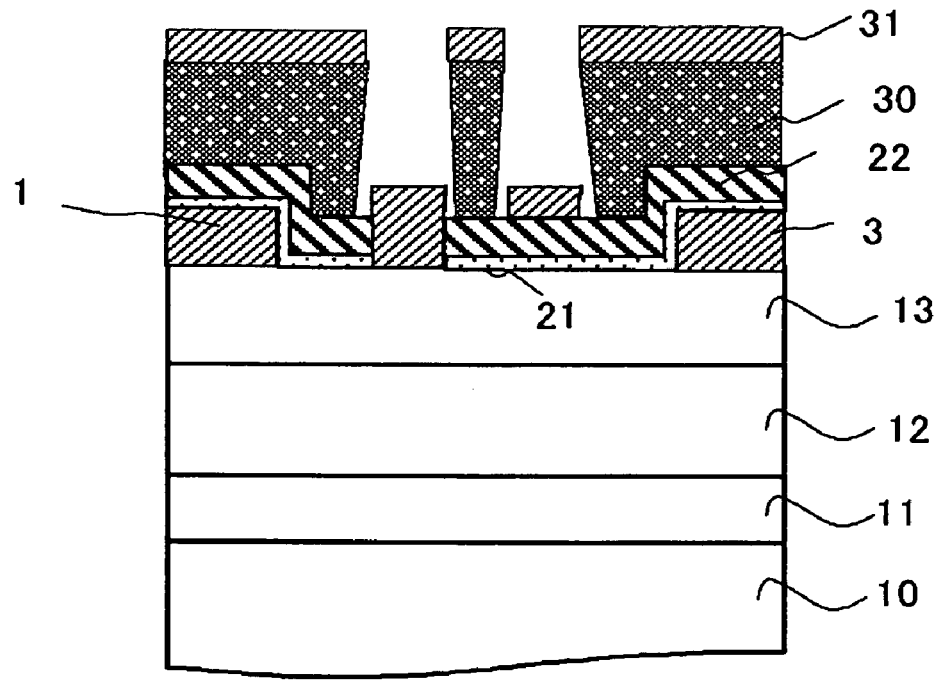
FIG. 23 is a view showing a method of manufacturing a transistor according to Example.
Figure 23:
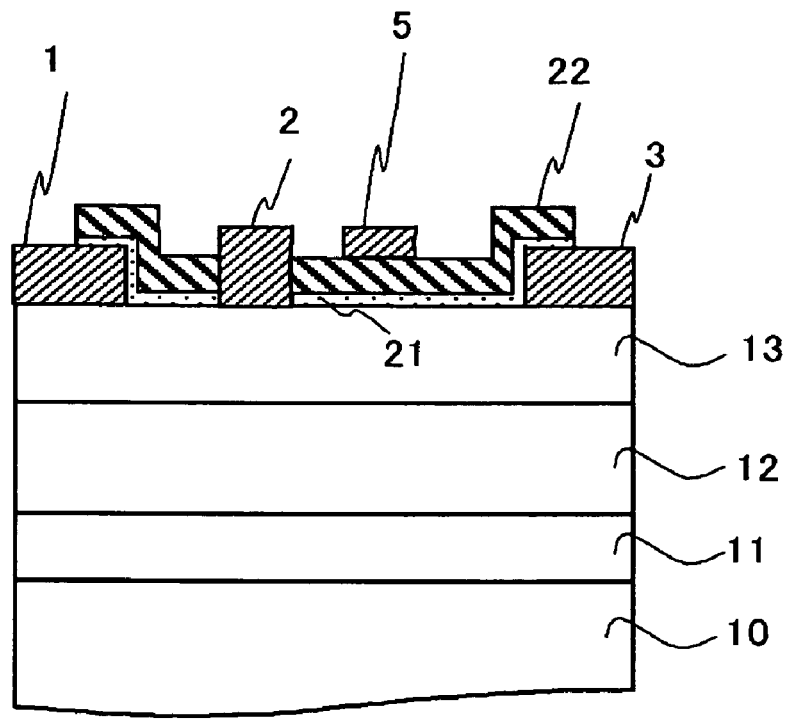
Figure 24:
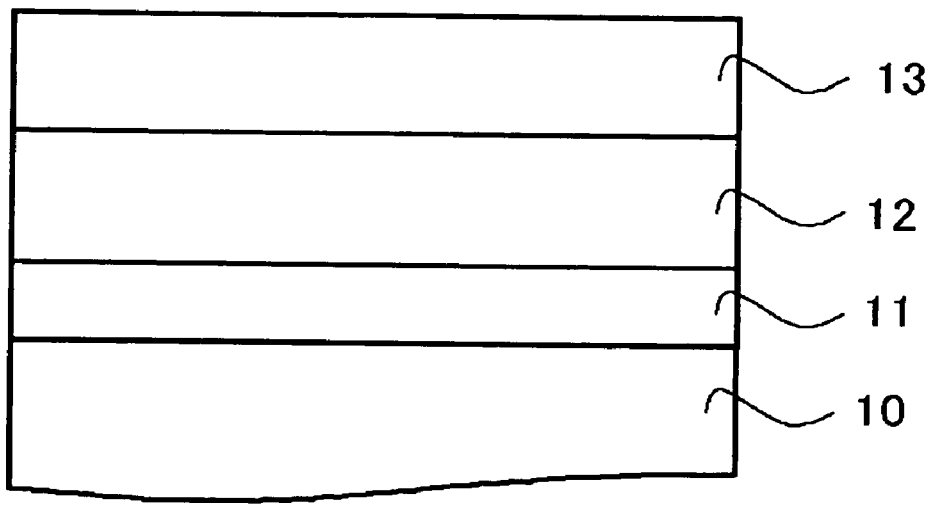
FIG. 24 is a view showing a method of manufacturing a transistor according to Example.
Figure 24:
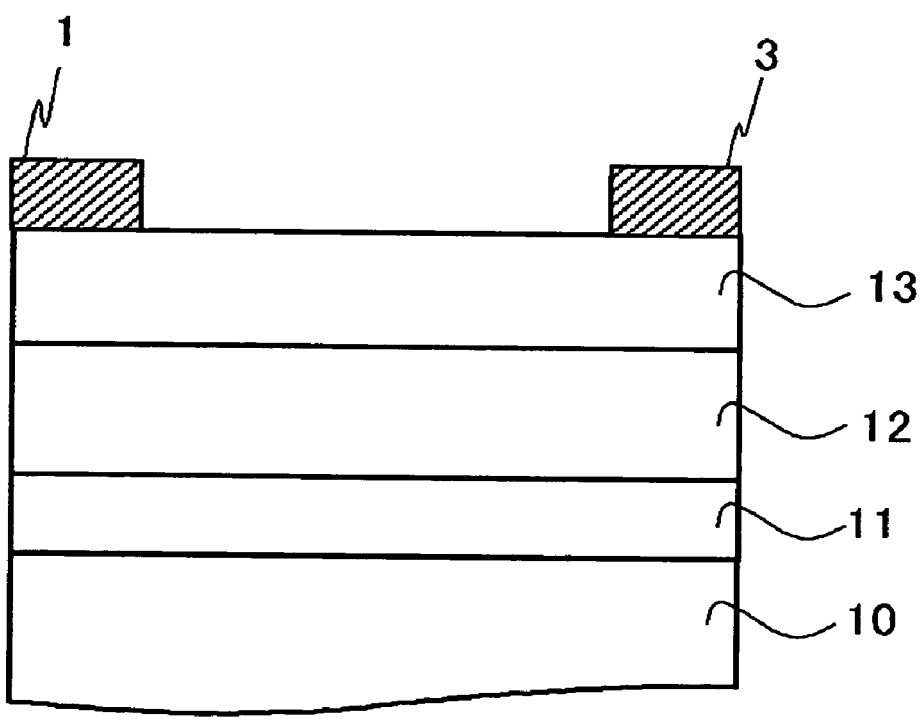
Figure 25:
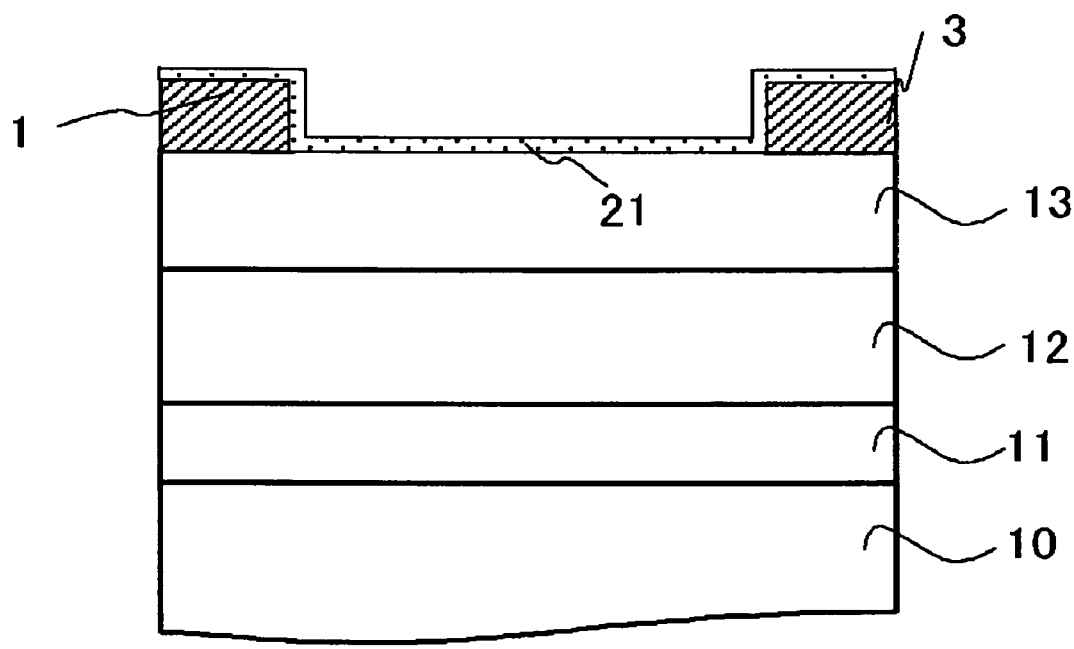
FIG. 25 is a view showing a method of manufacturing a transistor according to Example.
Figure 25:
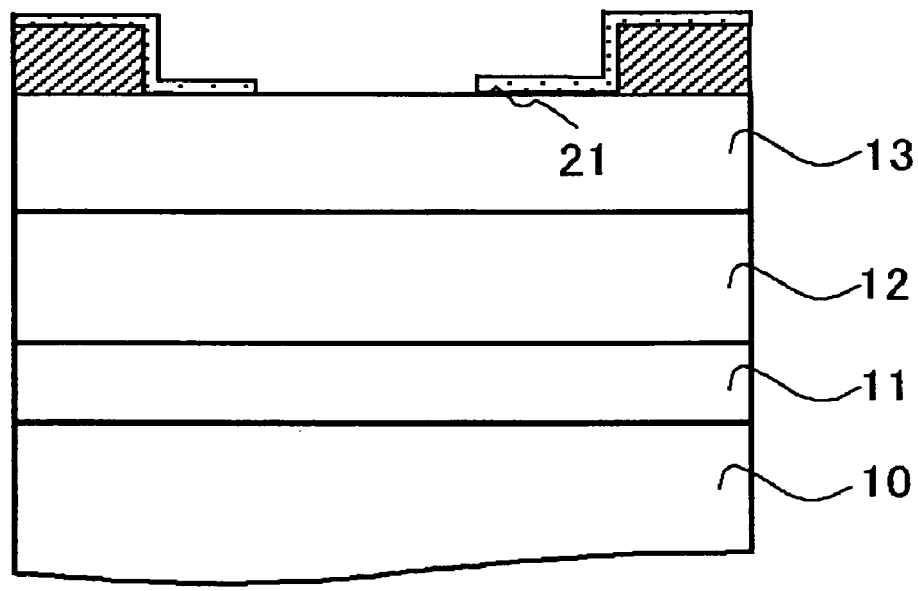
Figure 26:
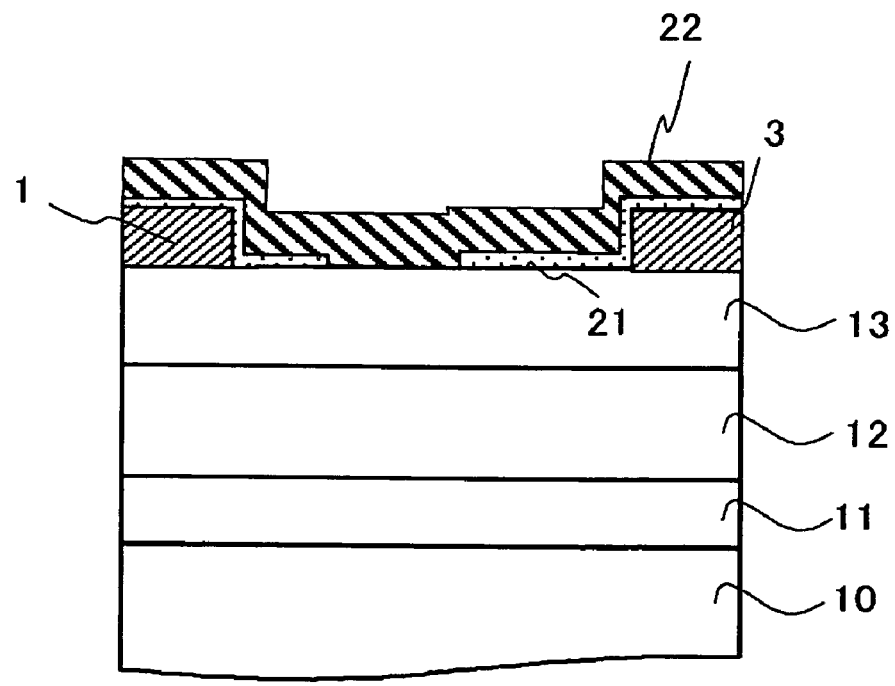
FIG. 26 is a view showing a method of manufacturing a transistor according to Example.
Figure 26:
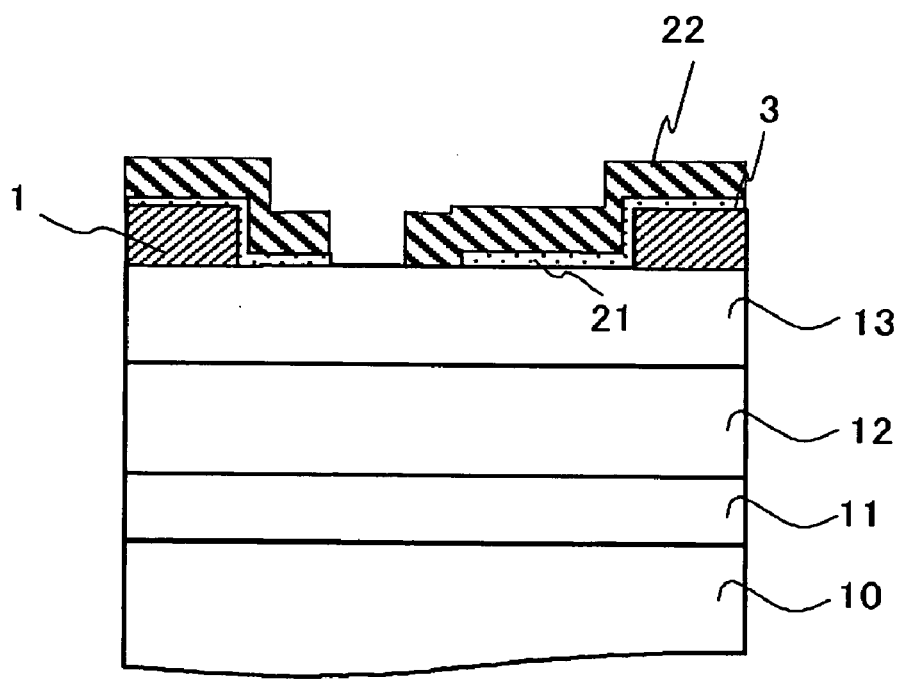
Figure 27:
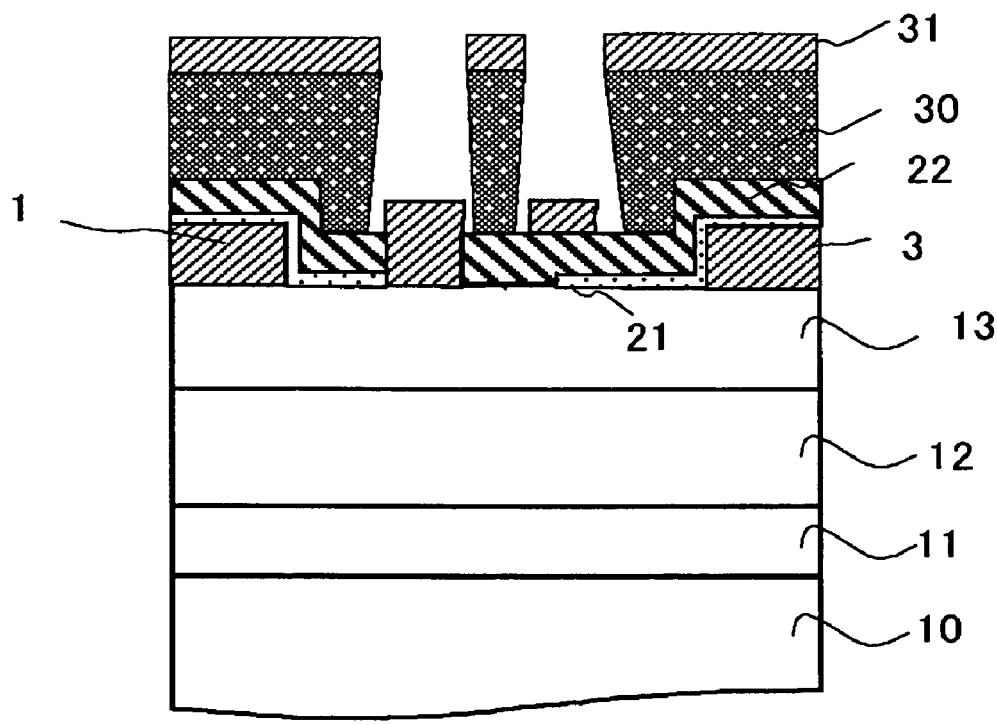
FIG. 27 is a view showing a method of manufacturing a transistor according to Example.
Figure 27:
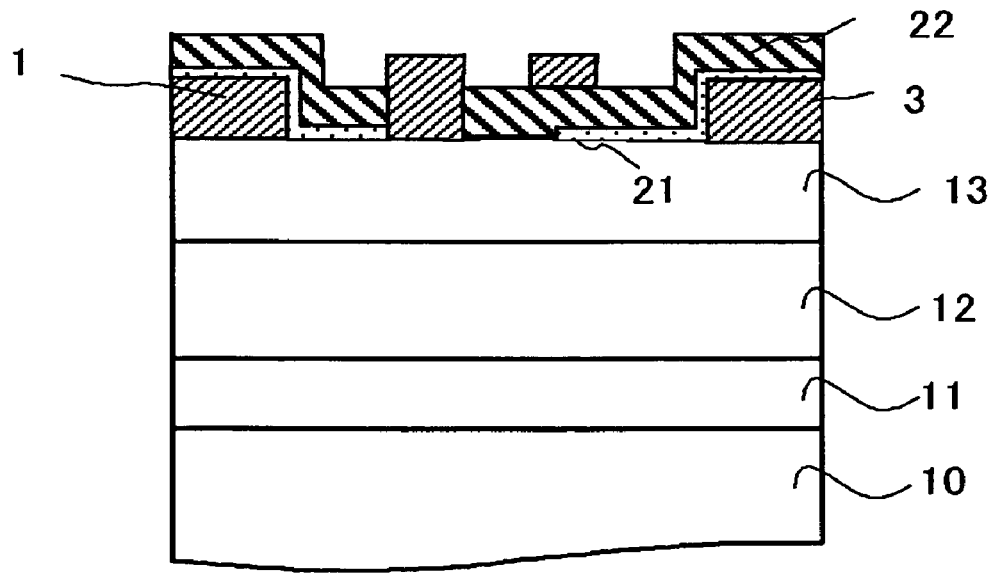

Referring to FIGS. 21 to 23, a method of manufacturing HJFET according to Example 1 will be described below. At first, the semiconductor is grown on the substrate 10 made of SiC by a molecular beam epitaxy (MBE) growth method. Similarly, the buffer layer 11 (film thickness of 20 nm) made of undoped AlN, the channel layer 12 (film thickness of 2 μm) made of undoped GaN, and the AlGaN electron supply layer 13 (film thickness of 25 nm) made of undoped $Al_{0.2}Ga_{0.8}N$ are laminated in the order from the substrate side, which obtains the semiconductor layer structure (FIG. 21A).

An inter-element separation mesa (not shown) is formed by etching a part of the epitaxial layer structure until the GaN channel layer 12 is exposed. Then, the source electrode 1 and the drain electrode 3 are formed on the AlGaN electron supply layer 13 by evaporating metal such as Ti/Al, and the ohmic contact is secured by performing anneal at 650° C. (FIG. 21B). Then, the SiN film 21 (film thickness of 50 nm) is formed by a plasma CVD method or the like. The $SiO_2$ film 22 (film thickness of 150 nm) is further formed on the SiN film 21 by a normal-pressure CVD method or the like (FIG. 22C). An opening, in which the AlGaN electron supply layer 13 is exposed, is provided by etching a part of the SiN film 21 and the $SiO_2$ film 22 (FIG. 22D). A gate metal 31 made of Ni/Au and the like is evaporated on the exposed AlGaN electron supply layer 13 by using a photo resist 30, and the Schottky-contact gate electrode 2 is formed. The electric-field control electrode made of Ni/Au is simultaneously formed (FIGS. 23E and 23F). Thus, HJFET shown in FIG. 1 is produced. In Example 1, the gate electrode 2 and the electric-field control electrode 5 are simultaneously formed. However, it is possible that the gate electrode 2 and the electric-field control electrode 5 are respectively formed through separate processes (a process in which the resist having the opening provided is formed to form the electrode in the opening, is individually performed). In this case, the gate electrode 2 and the electric-field control electrode 5 can be formed with the shorter distance.

In Example 1, when the high reverse voltage is applied between the gate and the drain, the electric field applied to the drain side end of the gate electrode is relaxed by the action of the electric-field control electrode, which improves the gate breakdown voltage. Further, during the large signal operation, the surface potential is modulated by the electric-field control electrode, so that response speed of surface trap is increased to suppress the collapse. Namely, the balance among the collapse, the gate breakdown voltage, and the gain is remarkably improved. Further, even if the surface state is fluctuated by variations in manufacturing process and the like, good performance can stably be realized.

Further, the electric-field control electrode in Example 1 can be controlled independently of the gate electrode. In this case, because the surface trap response can be suppressed by fixing the surface potential, the potential of the electric-field control electrode is caused to become equal to that of the gate electrode. Therefore, when compared with the case in which the surface potential is modulated, the collapse can further effectively be suppressed. Particularly, in the Group III nitride semiconductor element of the present invention in which the influence of the surface negative charge becomes major concerns, it is remarkably effective that the electric-field control electrode can independently be controlled.

When the potential of the electric-field control electrode is fixed as described above, even if the potential of the gate electrode is fluctuated, the gate capacity is hardly changed, so that the large decrease in gain can be suppressed.

Further, Example 1 has the structure in which the multi-layered film of SiN and $SiO_2$ is formed immediately below the electric-field control electrode, so that the breakdown voltage can be increased when compared with the structure formed only by SiN. Particularly, while the thin SiN film is formed to an extent in which the aged deterioration in film quality is not generated (the thickness of the SiN film is not more than 150 nm, preferably not more than 100 nm) the thick $SiO_2$ film contributing effectively to the improvement of the breakdown voltage is deposited. Therefore, the increase in capacity can effectively be suppressed. As a result, the transistor which is excellent for the reliability and the high-frequency gain can be obtained.

When the size of the electric-field control electrode is not lower than 0.3 µm, the collapse suppression effect is sufficiently obtained. It is preferable that the size of the electric-field control electrode is not lower than 0.5 µm. It is preferable that the end of the electric-field control electrode is located at a position where the end of the electric-field control electrode does not overlap the drain electrode. As the size of the electric-field control electrode is increased, the collapse suppression effect is increased. However, when the end of the electric-field control electrode on the drain electrode side exceeds 70% of the distance between the gate electrode and the drain electrode (distance between the end on the drain electrode side of the gate electrode and the end on the gate electrode side of the drain electrode), the gate breakdown voltage tends to be decreased, because the gate breakdown voltage is determined by the electric field concentration between the electric-field control electrode and the drain electrode. Therefore, it is preferable that the size of the electric-field control electrode is formed not more than 70% of the distance between the gate electrode and the drain electrode.

In Example 1, the $SiO_2$ film is formed as the upper layer of the surface protection film. From the viewpoints of the gain improvement and the reliability improvement, it is more preferable to use the low-dielectric-constant film having the dielectric constants not more than 4. SiOC (sometimes referred to as SiOCH), BCB (benzocyclobutene), FSG (flourosilicate glass: SiOF), HSQ (hydrogen-Silsesquioxane), MSQ (methyl-Silsesquioxane), the organic polymer, and the material in which these are formed in porous can be cited as an example of the low-dielectric-constant material.

EXAMPLE 2

Figure 2:
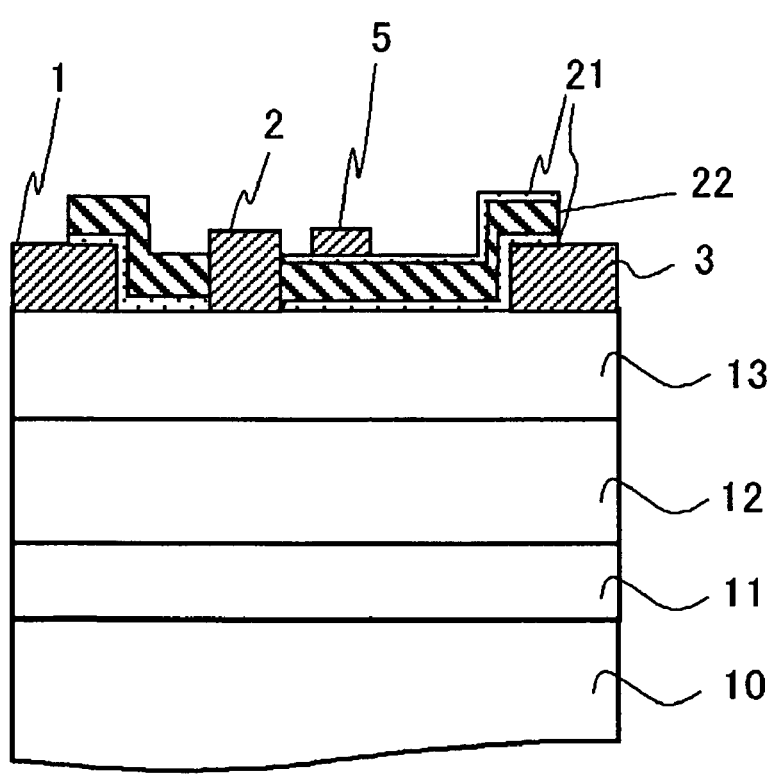
FIG. 2 is a view showing a transistor structure according to Example.

In Example 2, as shown in FIG. 2, the insulating film is formed on the AlGaN electron supply layer 13 (on the Group III nitride semiconductor layer), and has a three-layer structure in which the SiN film 21, the $SiO_2$ film 22, and the SiN film 21 are sequentially laminated. The semiconductor layer structure below the gate electrode is similar to Example 1. In the structure of Example 2, the uppermost layer of the insulating film is formed not by the $SiO_2$ film 22 but by the SiN film 21, so that the resist is easily stably formed to improve the yield in the process of manufacturing the element. In this case, as with the SiN film provided in the lowermost layer, from the viewpoint of the film reliability, it is preferable that the insulating film provided in the uppermost portion of the insulating film is set at the film thicknesses not more than 150 nm, and it is more preferable that the insulating film is set at the film thicknesses not more than 100 nm. Further, it is most preferable that the insulating film is formed as thin as possible.

EXAMPLE 3

Figure 3:
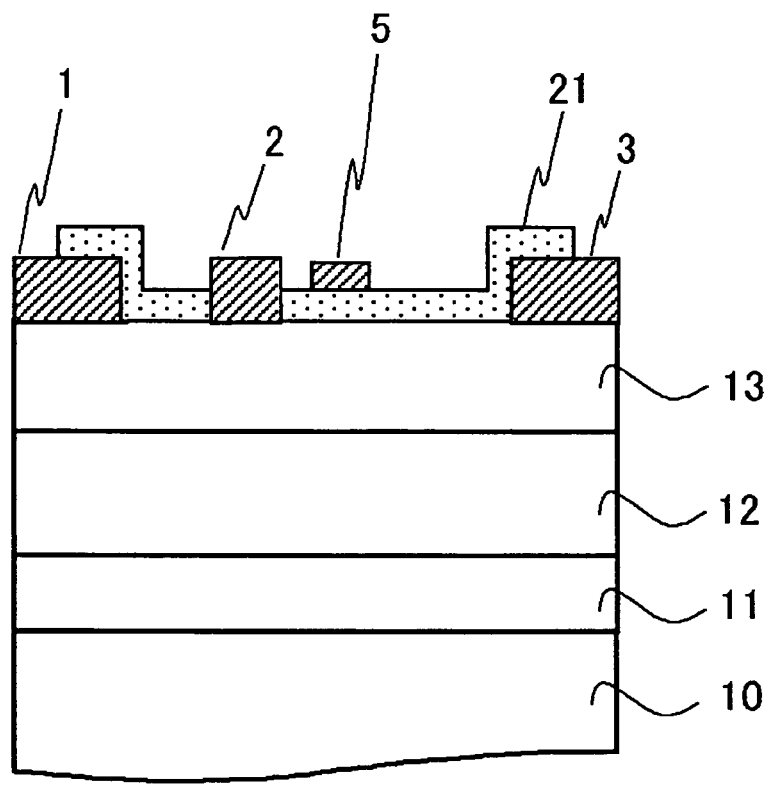
FIG. 3 is a view showing a transistor structure according to Example.

FIG. 3 shows a sectional structure of HJFET in Example 3. HJFET is formed on the substrate 10 made of the material such as SiC. The buffer layer 11 including the semiconductor layer is formed on the substrate 10. The GaN channel layer 12 is formed on the buffer layer 11. The AlGaN electron supply layer 13 is formed on the channel layer. The source electrode 1 and the drain electrode 3, in which the ohmic contact is secured, are formed on the electron supply layer. The gate electrode 2, in which the Schottky contact is secured, and the electric-field control electrode 5 are provided between the source electrode 1 and the drain electrode 3. The surface of the electron supply layer 13 is covered with the SiN film 21, and the SiN film 21 is provided immediately below the electric-field control electrode 5.

HJFET according to Example 2 is formed as follows: At first, the semiconductor is grown on the substrate 10 made of SiC by the molecular beam epitaxy growth method. Similarly, the buffer layer 11 (film thickness of 20 nm) made of undoped AlN, the channel layer 12 (film thickness of 2 µm) made of undoped GaN, and the AlGaN electron supply layer 13 (film thickness of 25 nm) made of undoped $Al_{0.2}Ga_{0.8}N$ are laminated in the order from the substrate side, which obtains the semiconductor layer.

Then, the inter-element separation mesa is formed by etching a part of the epitaxial layer structure until the GaN channel layer 12 is exposed. Then, the source electrode 1 and the drain electrode 3 are formed on the AlGaN electron supply layer 13 by evaporating the metal such as Ti/Al, and the ohmic contact is secured by performing the anneal at 650° C. Then, the SiN film 21 (film thickness of 150 nm) is formed by the plasma CVD method or the like. The metal made of Ni/Au and the like is evaporated on the AlGaN electron supply layer 13 exposed by etching a part of the SiN film 21, and the Schottky-contact gate electrode 2 is formed. The electric-field control electrode 5 is also formed at the same time. Thus, HJFET shown in FIG. 3 is produced.

In the transistor of Example 3, the SiN film 21 is used as the surface protection film. The SiN film 21 has the large internal stress, so that the film thickness cannot be larger. As the film thickness is decreased, the collapse suppression effect is decreased. However, in the structure of Example 3, the electric-field control electrode 5 is provided between the gate electrode 2 and the drain electrode 3, and the surface potential can be modulated by the electric-field control electrode 5. Therefore, the collapse can effectively be suppressed. The collapse can further effectively be suppressed by controlling the electric-field control electrode 5 independently of the gate electrode 2. This is because the collapse can more stably be suppressed by fixing the electric-field control electrode 5 to the potential at which the generation of the surface negative charge is suppressed when compared with the case in which the potential is modulated by setting the electric-field control electrode 5 at the same potential for the gate electrode 2. It is also possible that the electric-field control electrode 5 is set at the same potential for the source electrode 1. In this case, the device configuration can be simplified when compared with the independent control. In the structure of Example 3 in which the electric-field control electrode can independently be controlled, the transistor having the high gain and the excellent high-frequency characteristics can be realized, even if the film thickness of the surface protection film is thinner than that of the field plate electrode described in Non-Patent Reference 2. In the case of the field plate electrode, the potentials of the gate electrode and the field plate electrode (a portion except for the gate electrode) are simultaneously changed, and the decrease in gain is caused by the change in gate capacity. On the contrary, for the electric-field control electrode, the electric-field control electrode can be controlled independently of the gate electrode. Therefore, when the electric-field control electrode is set at the same potential for the gate electrode, even if the potential is changed in the gate electrode, the gate capacity is not changed and the decrease in gain can be suppressed.

Figure 29:
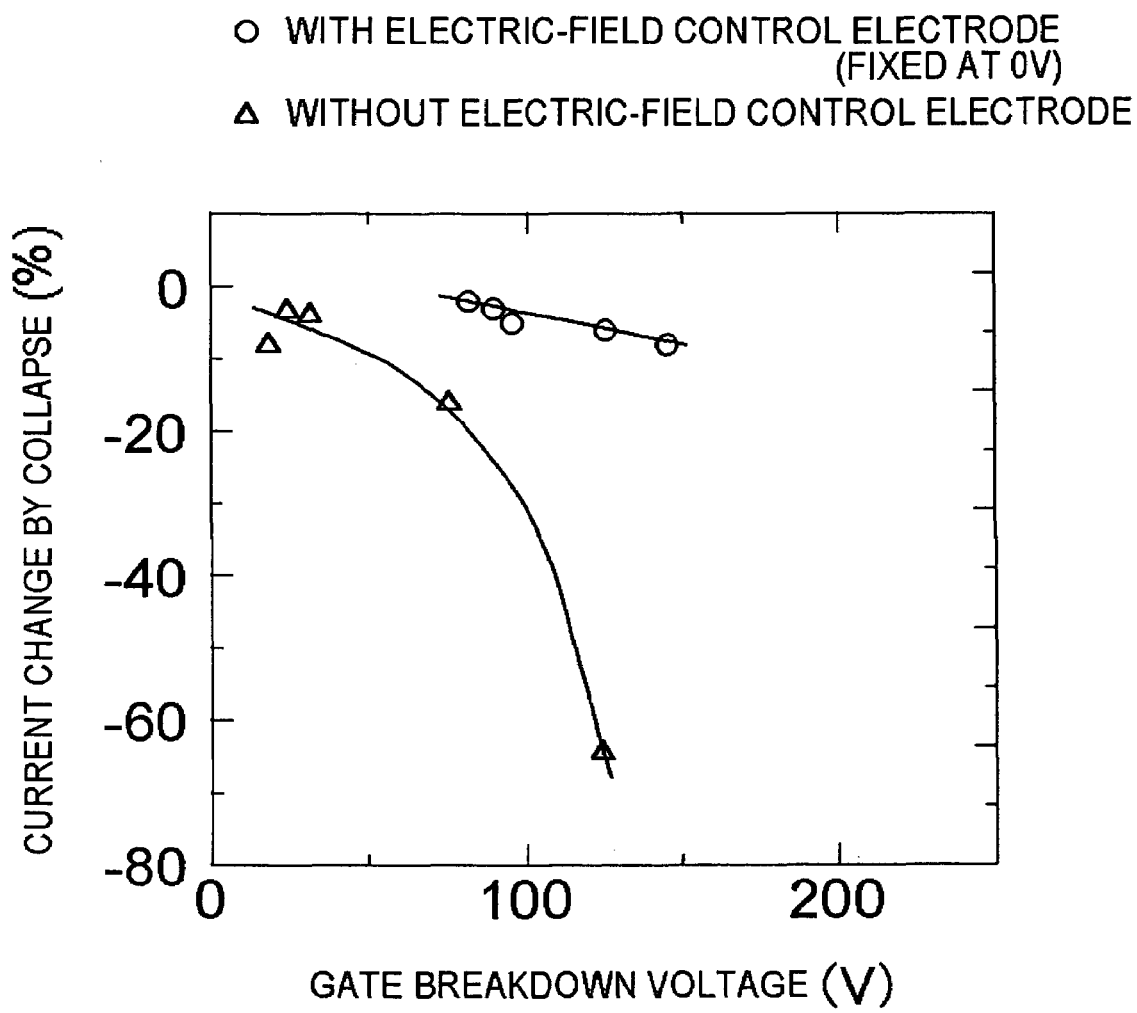
FIG. 29 is a view showing a relationship between gate breakdown voltage and collapse current change.
Figure 30:
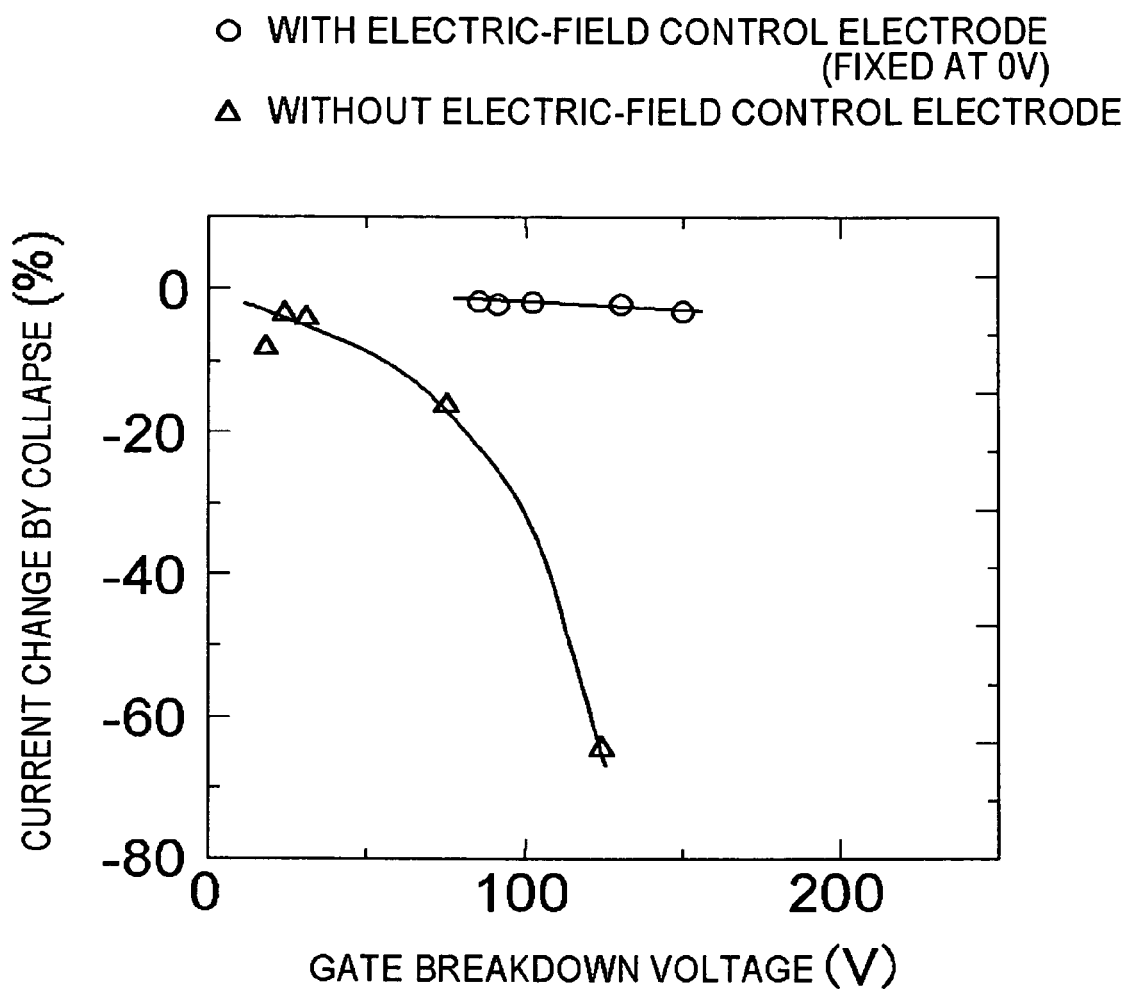
FIG. 30 is a view showing a relationship between gate breakdown voltage and collapse current change.

FIG. 29 and FIG. 30 are views in which the transistor according to Example 3 and the conventional transistor are compared to each other in the performance balance between the gate breakdown voltage and the collapse. The following prototype devices of Gr. 1 to Gr. 3 are similar to one another except for the absence or presence of the electric-field control electrode and the method of applying the potential to the electric-field control electrode.

Gr. 1
electric-field control electrode: presence (potential is fixed at 0V)
size of electric-field control electrode: 0.5 μm
distance between gate electrode and electric-field control electrode: 0.5 μm
protection film: five kinds of SiN films having the film thicknesses 10, 40, 60, 90, and 120 nm were evaluated Gr. 2
electric-field control electrode: absence
protection film: five kinds of devices with SiN films having the film thicknesses 10, 40, 60, 90, and 120 nm were evaluated Gr. 3
electric-field control electrode: presence (potential is fixed at 0V)
size of electric-field control electrode: 0.5 μm
distance between gate electrode and electric-field control electrode: 1.0 μm
protection film: five kinds of SiN films having the film thicknesses 10, 40, 60, 90, and 120 nm were evaluated FIG. 29 is a characteristic view of the devices Gr. 1 and Gr. 2, and FIG. 30 is a characteristic view of devices Gr. 3 and Gr. 2, In the devices having the structure of the invention, it is found that the high gate breakdown voltage is compatible with the collapse suppression. Particularly, as the size of the electric-field control electrode is increased, the collapse suppression effect becomes larger.

When the size of the electric-field control electrode is not lower than 0.3 μm, the collapse suppression effect is sufficiently obtained. It is preferable that the size of the electric-field control electrode is not lower than 0.5 μm. It is preferable that the end of the electric-field control electrode is located at a position where the end of the electric-field control electrode does not overlap the drain electrode. As the size of the electric-field control electrode is increased, the collapse suppression effect is increased. However, when the end of the electric-field control electrode on the drain electrode side exceeds 70% of the distance between the gate electrode and the drain electrode (distance between the end on the drain electrode side of the gate electrode and the end on the gate electrode side of the drain electrode), the gate breakdown voltage tends to be decreased, because the gate breakdown voltage is determined by the electric field concentration between the electric-field control electrode and the drain electrode. Therefore, it is preferable that the size of the electric-field control electrode is formed not more than 70% of the distance between the gate electrode and the drain electrode.

Figure 18:
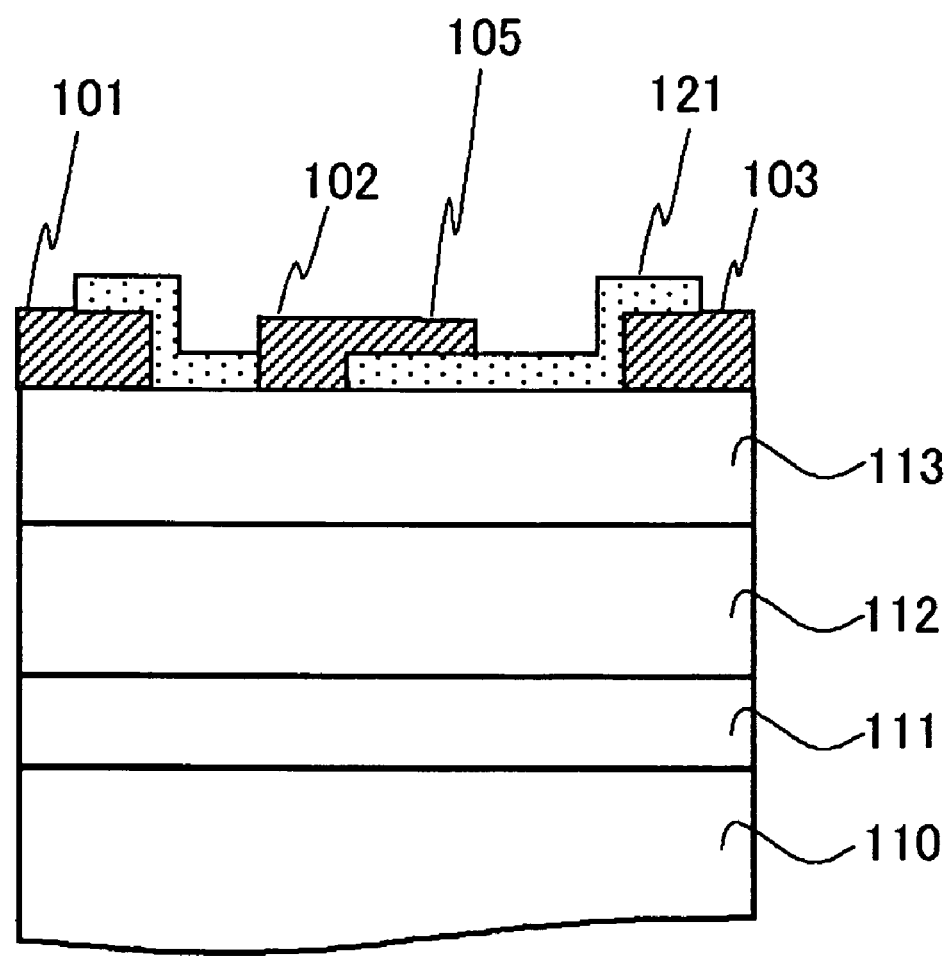
FIG. 18 is a view showing a structure of a conventional transistor.
Figure 19:
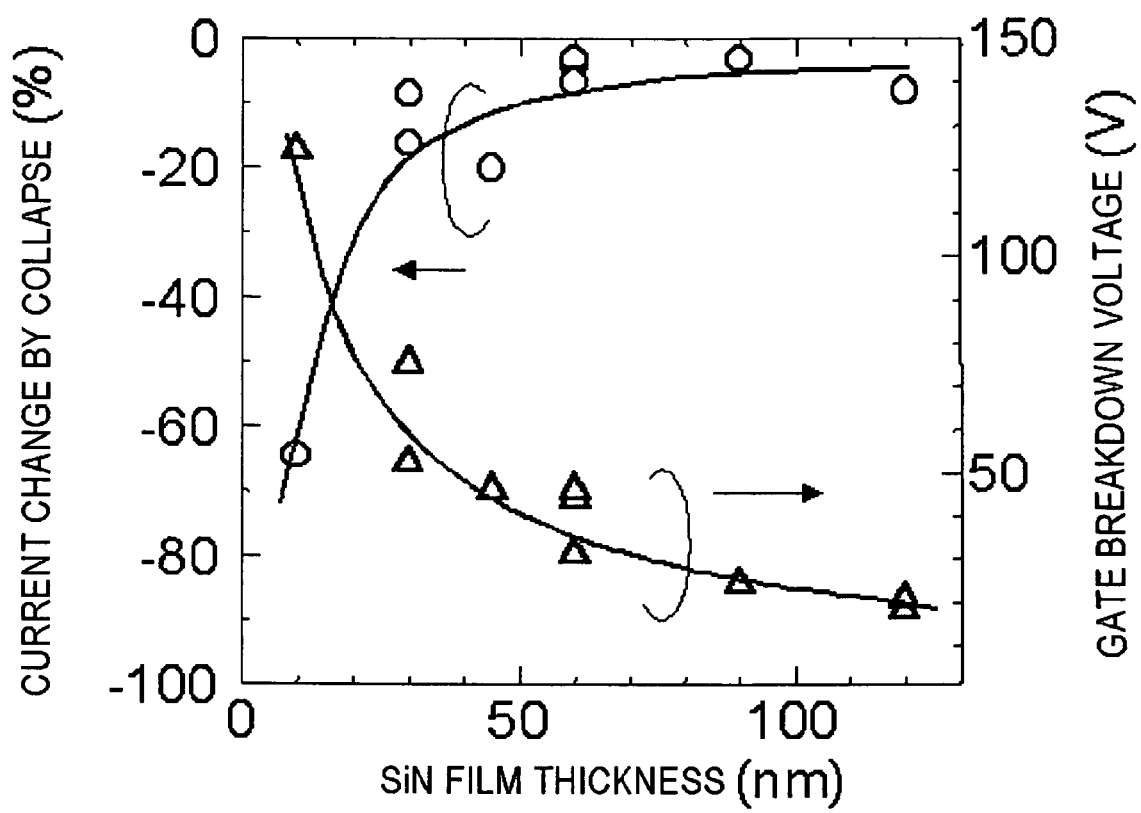
FIG. 19 is a view for explaining a trade-off between gate breakdown voltage and collapse.
Figure 20:
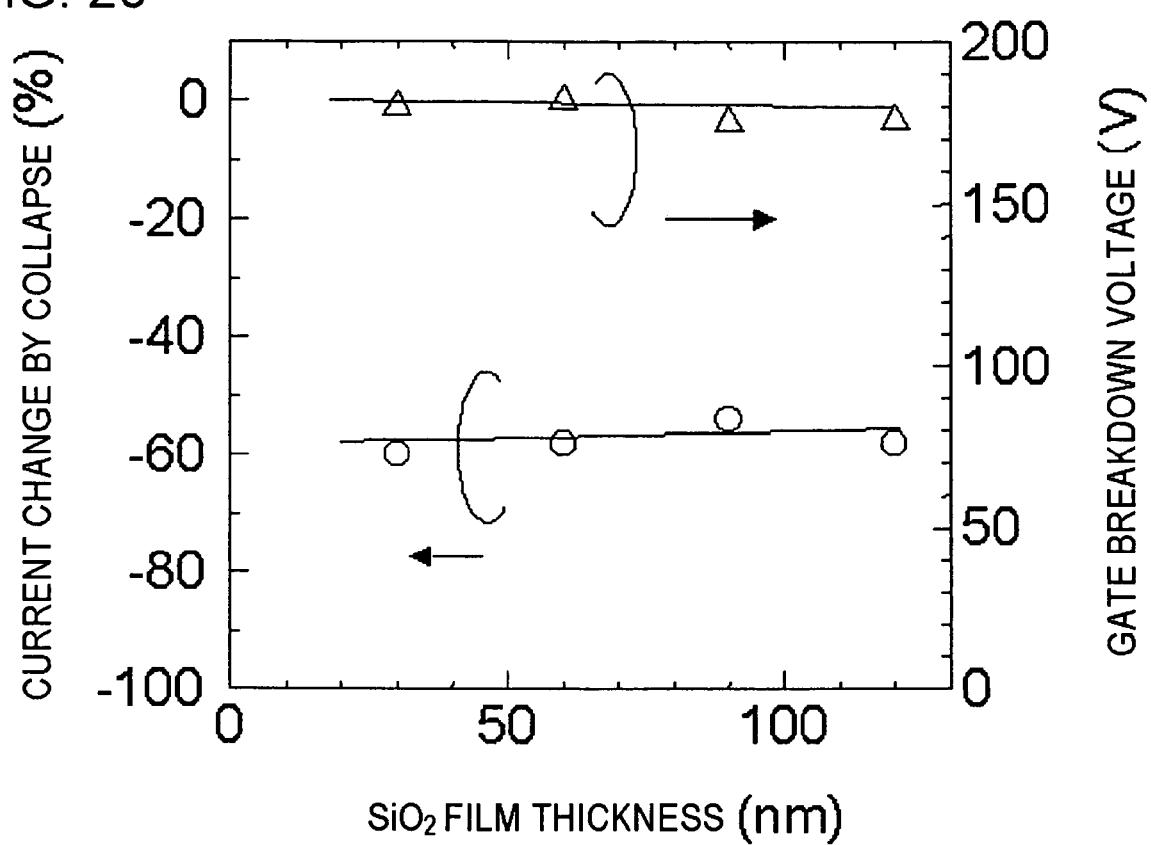
FIG. 20 is a view for explaining a trade-off between gate breakdown voltage and collapse.
Figure 31:
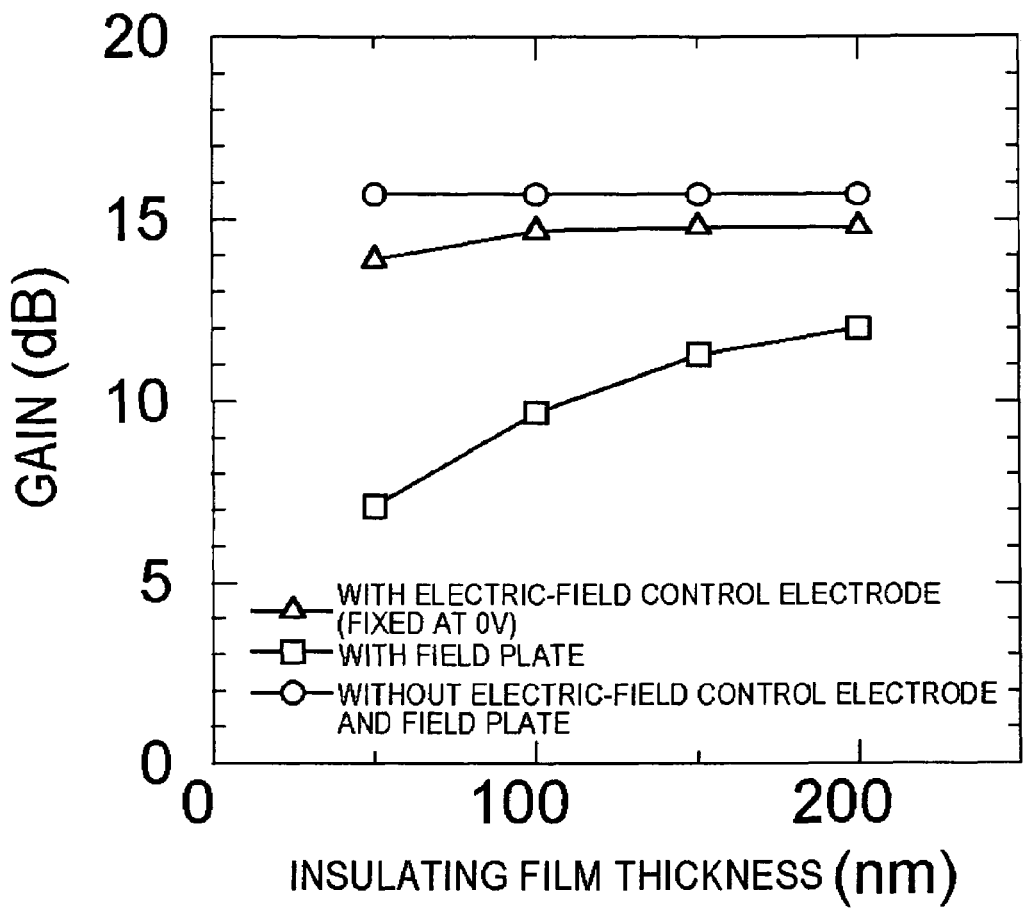
FIG. 31 is a view showing a relationship between a thickness of an insulating film and a gain.

FIG. 31 shows the relationship between the gain and the film thickness of the SiN film. In FIG. 31, the change in gain is shown when the film thickness of the SiN film 21 is changed for each of the transistor having the field plate electrode described in Non-Patent Reference 2 (FIG. 18), the transistor having the structure of Example 3 in which the electric-field control electrode is provided (FIG. 3), and the transistor having only the conventional gate electrode. The length of the field plate electrode (length of hood portion) is set at 1 μm, the size of the electric-field control electrode in the structure of Example 3 is set at 0.5 μm, the distance between the gate electrode and the electric-field control electrode is set at 0.5 μm, and the electric-field control electrode is fixed at 0V. As can be seen from FIG. 31, in the transistor having the structure of Example 3, the decrease in gain can remarkably be suppressed across the range from 50 nm to 200 nm of the film thickness of the SiN film 21, when compared with the transistor having the field plate electrode. Thus, the transistor having the structure of Example 3 is the transistor in which the high gate breakdown voltage, the collapse suppression, and the high gain can be achieved.

From the viewpoint of film reliability, it is preferable that the film thickness of the SiN film 21 is not more than 150 nm in the structure of Example 3, It is more preferable that the film thickness is not more than 100 nm. When the film thickness is lower than 10 nm, the collapse suppression effect becomes remarkably small. Therefore, it is preferable that the film thickness is not lower than 10 nm.

In Example 3, it is preferable that the size of the electric-field control electrode 5 (size in the direction of the gate-drain electrode) is not lower than 0.3 μm. It is more preferable that the size of the electric-field control electrode is not lower than 0.5 μm. It is preferable that the end of the electric-field control electrode is located at the position where the end of the electric-field control electrode does not overlap the drain electrode. It is more preferable that the size of the electric-field control electrode is formed not more than 70% of the distance between the gate electrode and the drain electrode.

EXAMPLE 4

Figure 4:
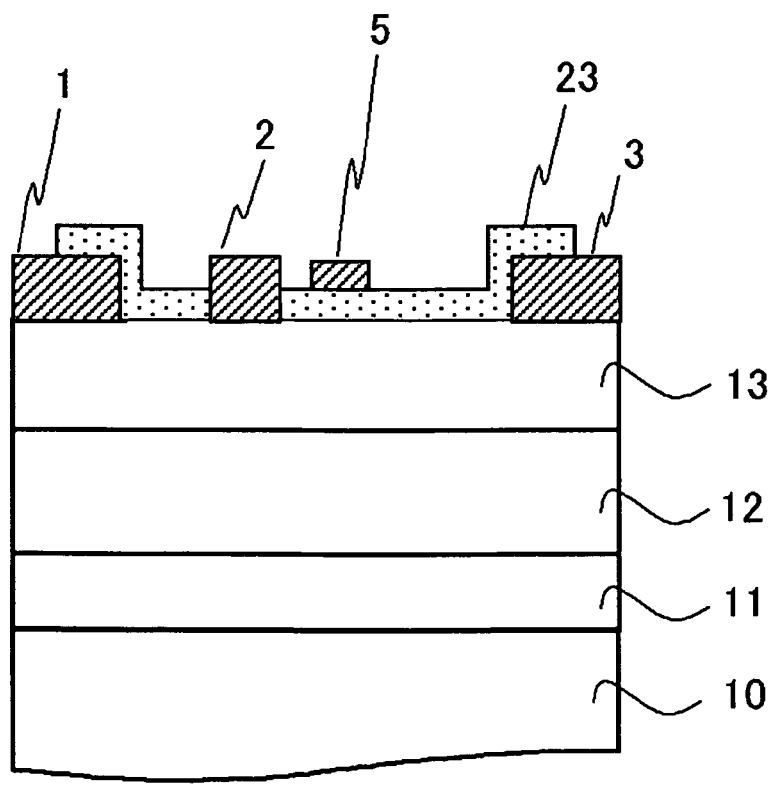
FIG. 4 is a view showing a transistor structure according to Example.

FIG. 4 shows a sectional structure of HJFET in Example 4. HJFET is formed on the substrate 10 made of the material such as SiC. The buffer layer 11 including the semiconductor layer is formed on the substrate 10. The GaN channel layer 12 is formed on the buffer layer 11. The AlGaN electron supply layer 13 is formed on the channel layer. The source electrode 1 and drain electrode 3, in which the ohmic contact is secured, are formed on the electron supply layer. The gate electrode 2, in which the Schottky contact is secured, and the electric-field control electrode 5 are provided between the source electrode 1 and the drain electrode 3. The surface of the electron supply layer 13 is covered with a SiON film 23, and the SiON film 23 is provided immediately below the electric-field control electrode 5.

HJFET according to Example 4 is formed as follows: At first, the semiconductor is grown on the substrate 10 made of SiC by the molecular beam epitaxy growth method. Similarly, the buffer layer 11 (film thickness of 20 nm) made of undoped AlN, the channel layer 12 (film thickness of 2 μm) made of undoped GaN, and the AlGaN electron supply layer 13 (film thickness of 25 nm) made of undoped $Al_{0.2}Ga_{0.8}N$ are laminated in the order from the substrate side, which obtains the semiconductor layer.

Then, the inter-element separation mesa is formed by etching a part of the epitaxial layer structure until the GaN channel layer 12 is exposed. Then, the source electrode 1 and the drain electrode 3 are formed on the AlGaN electron supply layer 13 by evaporating the metal such as Ti/Al, and the ohmic contact is secured by performing the anneal at 650° C. Then, the SiON film 23 (film thickness of 150 nm) is formed by the plasma CVD method or the like. The metal made of Ni/Au and the like is evaporated on the AlGaN electron supply layer 13 exposed by etching a part of the SiON film 23, and the Schottky-contact gate electrode 2 is simultaneously formed. Thus, HJFET shown in FIG. 4 is produced.

Figure 28:
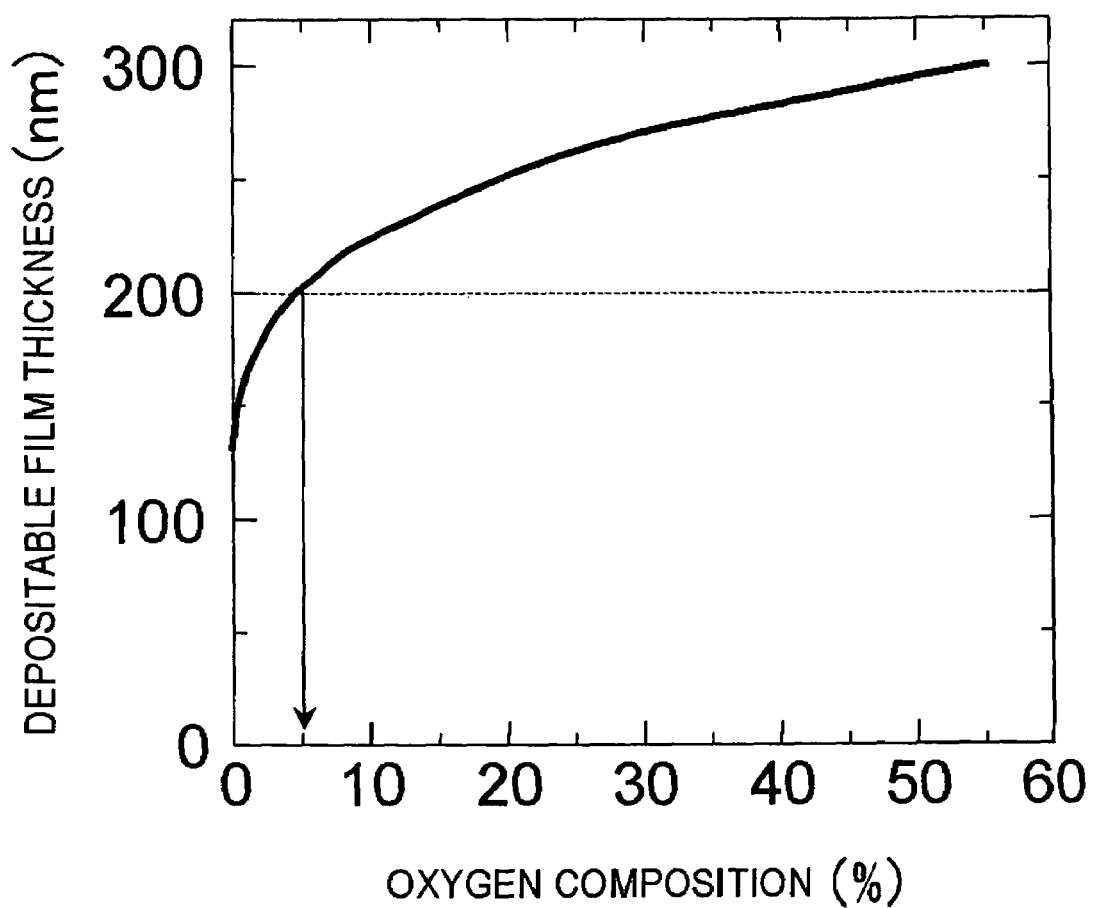
FIG. 28 is a view for explaining a film thickness of SiON which can be deposited.

In the transistor of Example 4, the SiON film is used as the surface protection film. When compared with the SiN film, the SiON film has the smaller internal stress generated in the film. FIG. 28 is a view showing a result of study on the film thickness in which the film can be grown without generating crack when SiON film and the SiN film are deposited by a plasma CVD method. In this case, an oxygen content ratio in SiON is changed to study the corresponding growable film thickness. It is found that the growable film thickness is increased as the oxygen content ratio is increased. Namely, when compared with the case in which the SiN film is formed below the electric-field control electrode, in Example 4, the insulating film can be formed thicker, and the high-frequency gain can be improved by the decrease in capacity below the electric-field control electrode.

At this point, when the oxygen content ratio becomes too large, the collapse improvement effect is not sufficiently obtained. According to the study of the inventor, from the viewpoint of the collapse improvement, it is preferable that the oxygen proportion is not more than 50%. From the viewpoints of the collapse and the high-frequency gain, it is desirable that the film thickness is not lower than 200 nm in the SiON film located below the electric-field control electrode. Since the oxygen content ratio corresponding to the growable film thickness of 200 nm is 5% (in terms of mole), when the SiON film is used, it is preferable that the oxygen content ratio is not lower than 5%.

In the SiON film of Example 4, it is preferable that the refractive index ranges from 1.65 to 2.05.

In Example 4, it is preferable that the size of the electric-field control electrode is not lower than 0.3 μm. It is more preferable that the size of the electric-field control electrode is not lower than 0.5 μm. It is preferable that the end of the electric-field control electrode is located at the position where the end of the electric-field control electrode does not overlap the drain electrode. It is more preferable that the size of the electric-field control electrode is formed not more than 70% of the distance between the gate electrode and the drain electrode.

In Example 4, the protection film is formed by the SiON film. However, the protection film is not limited to the SiON film. It is also possible that SiCN, SiOCN, and the like are used as the protection film.

EXAMPLE 5

Figure 5:
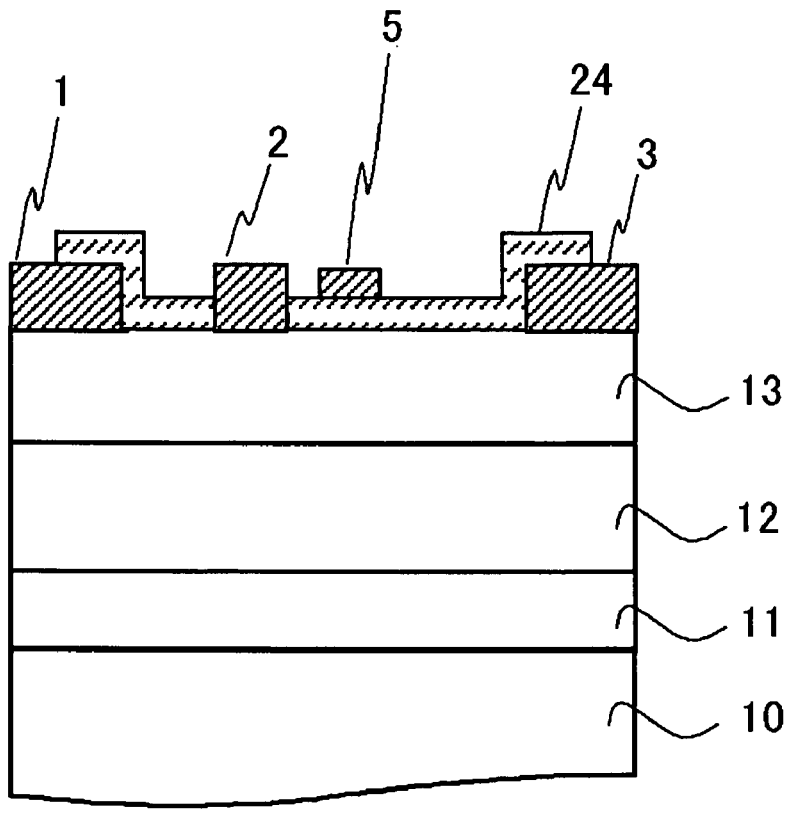
FIG. 5 is a view showing a transistor structure according to Example.

FIG. 5 shows a sectional structure of HJFET in Example 5. HJFET is formed on the substrate 10 made of the material such as SiC. The buffer layer 11 including the semiconductor layer is formed on the substrate 10. The GaN channel layer 12 is formed on the buffer layer 11. The AlGaN electron supply layer 13 is formed on the channel layer. The source electrode 1 and the drain electrode 3, in which the ohmic contact is secured, are formed on the electron supply layer. The gate electrode 2, in which the Schottky contact is secured, and the electric-field control electrode 5 are provided between the source electrode 1 and the drain electrode 3. The surface of the electron supply layer 13 is covered with a SiOC film 24, and the SiOC film 24 is provided immediately below the electric-field control electrode 5.

HJFET of Example 5 is formed as follows: At first, the semiconductor is grown on the substrate 10 made of SiC by the molecular beam epitaxy growth method. Similarly, the buffer layer 11 (film thickness of 20 nm) made of undoped AlN, the channel layer 12 (film thickness of 2 μm) made of undoped GaN, and the AlGaN electron supply layer 13 (film thickness of 25 nm) made of undoped $Al_{0.2}Ga_{0.8}N$ are laminated in the order from the substrate side, which obtains the semiconductor layer structure.

Then, the inter-element separation mesa is formed by etching a part of the epitaxial layer structure until the GaN channel layer 12 is exposed. Then, the source electrode 1 and the drain electrode 3 are formed on the AlGaN electron supply layer 13 by evaporating the metal such as Ti/Al, and the ohmic contact is secured by performing the anneal at 650° C. Then, the SiOC film 24 (film thickness of 200 nm) is formed by the plasma CVD method. The metal made of Ni/Au and the like is evaporated on the AlGaN electron supply layer 13 exposed by etching a part of the SiON film 24, and the Schottky-contact gate electrode 2 is formed. The electric-field control electrode 5 is also formed at the same time. Thus, HJFET shown in FIG. 5 is produced.

In Example 5, the SiOC film is used as the surface protection film. When compared with the SiN film, the SiOC film has the smaller stress, and the SiOC film does not affect the piezo polarization of the AlGaN layer, even if the film thickness is increased. Therefore, the surface charge is controlled to suppress the collapse by the electric-field control electrode, however, the SiOC film has no collapse suppression effect. In Example 5, it is preferable that the size of the electric-field control electrode is not lower than 0.3 μm. It is more preferable that the size of the electric-field control electrode is not lower than 0.5 μm. It is preferable that the end of the electric-field control electrode is located at the position where the end of the electric-field control electrode does not overlap the drain electrode. It is more preferable that the size of the electric-field control electrode is formed not more than 70% of the distance between the gate electrode and the drain electrode.

In Example 5, the SiOC film having the dielectric constant of about 2.5 is used as the surface protection film. In addition, it is also possible that other low-dielectric constant films (dielectric constants not more than 3.5) are used as the surface protection film. In this case, it is preferable to use the film in which the smaller stress (internal stress) is generated. SiOC (sometimes referred to as SiOCH), BCB (benzocyclobutene), FSG (flourosilicate glass: SiOF), HSQ (hydrogen-Silsesquioxane), MSQ (methyl-Silsesquioxane), the organic polymer, and the material in which these are formed in porous can be cited as an example of the low-dielectric-constant material. In addition, it is also possible that alumina is used as the surface protection film. Further, when AlN having the film thicknesses not more than the critical film thickness is used as the surface protection film, the effect of increasing heat dissipation from the element surface is obtained in addition to the effect by the electric-field control electrode. In the multi-layered film structure in which these films are combined, the same effect is also obtained.

EXAMPLE 6

Example 6 employs the protection film structure, in which a single-layer structure is formed near the gate electrode and a double-layer structure is formed in the area away from the gate electrode. Because the semiconductor layer structure below the gate electrode is similar to the above mentioned examples, the description of the semiconductor layer structure will be neglected.

Figure 6:
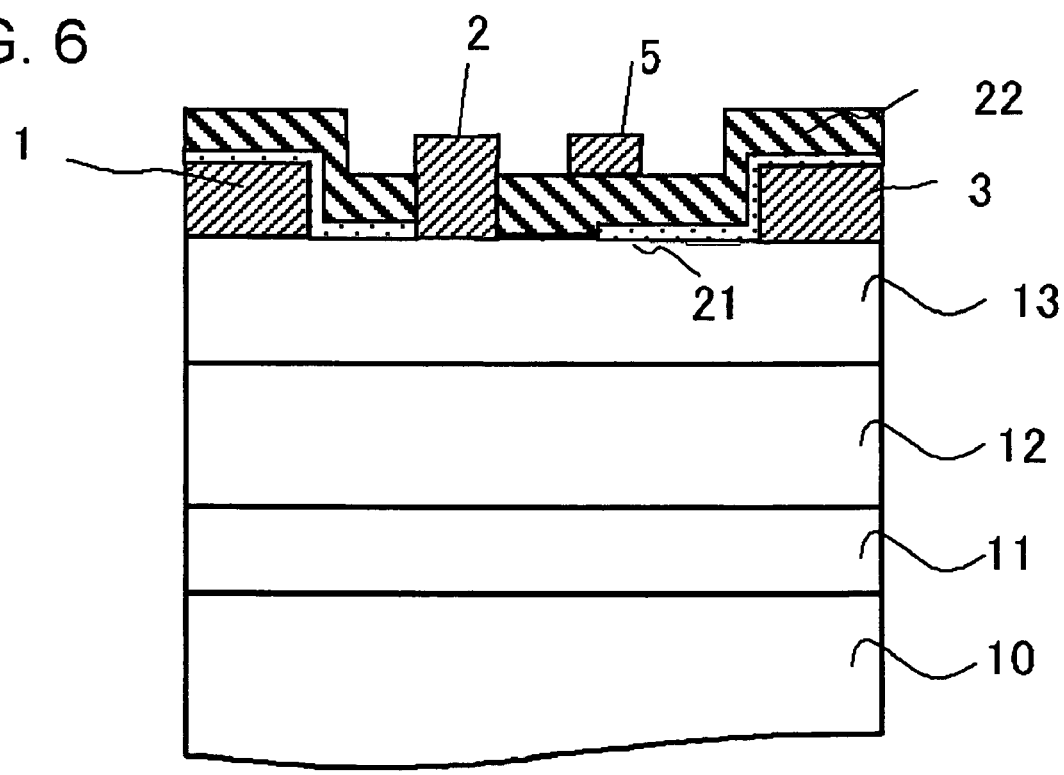
FIG. 6 is a view showing a transistor structure according to an example.

In FIG. 6, the gate electrode 2, the SiN film 21, and the $SiO_2$ film 22 are formed while the multilayered film of the SiN film 21 and the SiO₂ film 22 is separated from the gate electrode 2. A first area and a second area are formed below the electric-field control electrode 5. The first area is formed by the single-layer of the SiO₂ film 22. The second area is positioned on the drain side of the first area, and is formed by laminating the SiO₂ film 22 on the SiN film 21. In the structure of Example 6, while the SiO₂ film effective at the breakdown voltage improvement is provided on the gate electrode side, the SiN film effective at the collapse suppression is provided on the drain electrode side. Therefore, the field-effect transistor which not only improves the breakdown voltage but suppresses the collapse can be realized. Further, in the structure of the present invention, because the electric-field control electrode and the gate electrode can be controlled independently of each other, the adjustment can be performed so that the collapse is further suppressed. The decrease in gain can also be suppressed by fixing the electric-field control electrode at a predetermined potential (for example, the same potential as for the source electrode). In the structure of the insulating film in Example 6, the SiO₂ film is formed on the gate electrode side and the multilayered film of the SiN film and the SiO₂ film is formed on the drain electrode side. Further, it is possible that the SiN film is further provided on the insulating film. Because the SiN film has excellent adhesion properties to the resist when compared with the SiO₂ film, there is the advantage that the transistor is manufactured at good yield in the manufacturing process.

Referring to FIGS. 24 to 27, the method of manufacturing HJFET according to Example 6 will be described below. First, the semiconductor is grown on the substrate 10 made of SiC by the molecular beam epitaxy (MBE) growth method. Similarly, the buffer layer 11 (film thickness of 20 nm) made of undoped AlN, the channel layer 12 (film thickness of 2 μm) made of undoped GaN, and the AlGaN electron supply layer 13 (film thickness of 25 nm) made of undoped Al₀.₂Ga₀.₈N are laminated in the order from the substrate side, which obtains the semiconductor layer structure (FIG. 24A).

Then, the inter-element separation mesa (not shown) is formed by etching a part of the epitaxial layer structure until the GaN channel layer 12 is exposed. Then, the source electrode 1 and the drain electrode 3 are formed on the AlGaN electron supply layer 13 by evaporating the metal such as Ti/Al, and the ohmic contact is secured by performing the anneal at 650° C. (FIG. 24B). Then, the SiN film 21 (film thickness of 50 nm) is formed by the plasma CVD method or the like (FIG. 25C). Then, the opening through which the AlGaN electron supply layer 13 is exposed is provided by etching a part of the SiN film 21 (FIG. 25D). The SiO₂ film 22 (film thickness of 150 nm) is formed over the substrate by the normal-pressure CVD method or the like so that the opening is embedded (FIG. 26E). Then, the opening through which the AlGaN electron supply layer 13 is exposed is provided by etching a part of the SiO₂ film 22 (FIG. 26F). Then, the gate metal 31 made of Ni/Au and the like is evaporated on the exposed AlGaN electron supply layer 13 by using the photo resist 30, and the Schottky-contact gate electrode 2 and the electric-field control electrode 5 are simultaneously formed (FIGS. 27G and 27H). Thus, HJFET shown in FIG. 4 is produced. The transistor shown in FIG. 4 can stably be manufactured by the above procedure. In Example 6, the gate electrode 2 and the electric-field control electrode 5 are simultaneously formed. However, it is possible that the gate electrode 2 and the electric-field control electrode 5 are respectively formed through the separate processes (photo resist 30 is provided in each time when each electrode is formed, and each electrode is separately formed). In this case, the gate electrode 2 and the electric-field control electrode 5 can be formed with better controllability. For example, the both electrodes can be formed with the very narrow distance.

EXAMPLE 7

Figure 7:
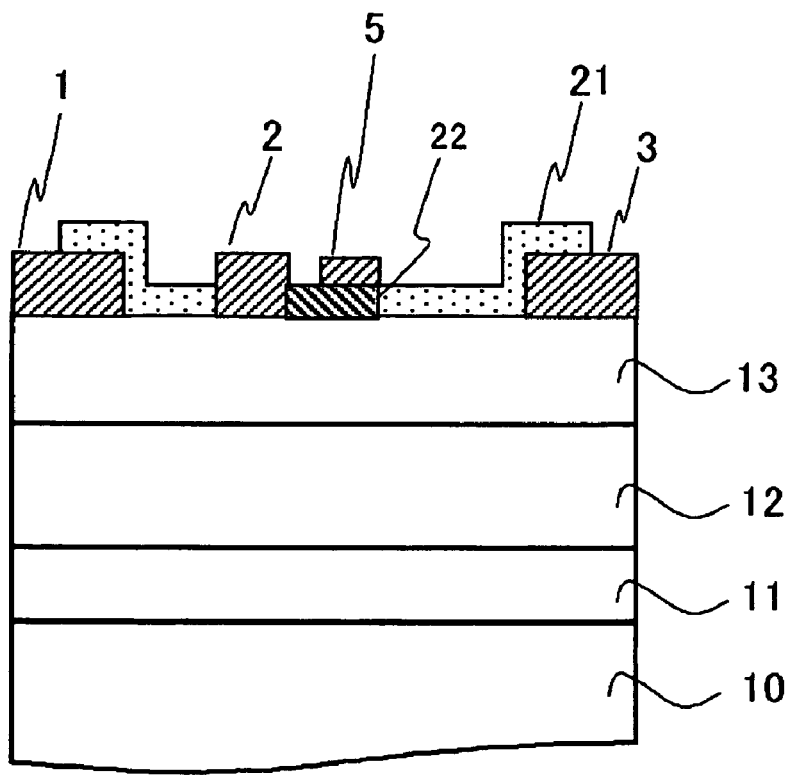
FIG. 7 is a view showing a transistor structure according to Example.
Figure 7:
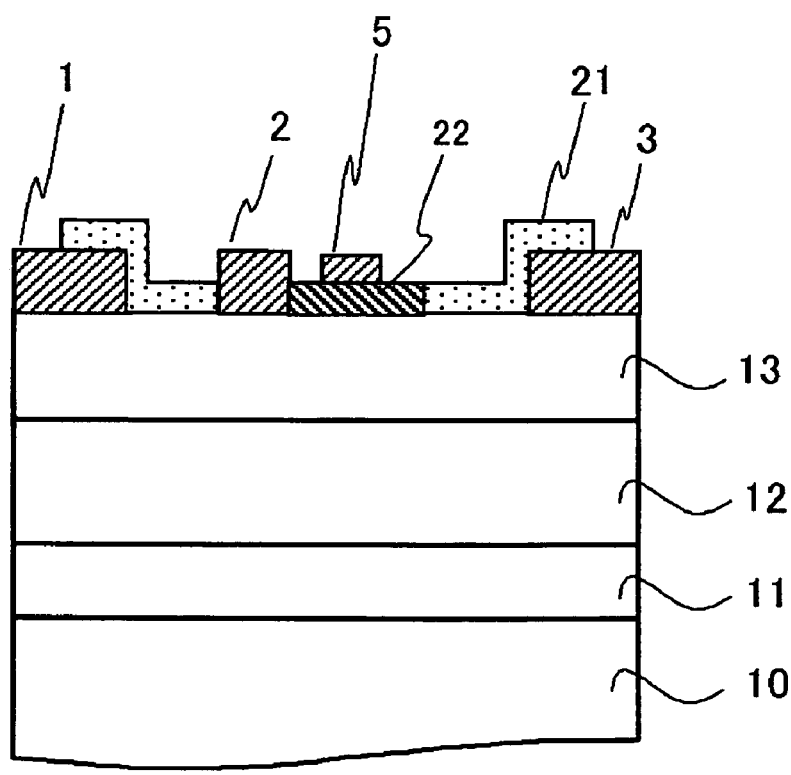

FIG. 7 shows a sectional structure of HJFET in Example 7. HJFET is formed on the substrate 10 made of the material such as SiC. The buffer layer 11 including the semiconductor layer is formed on the substrate 10. The GaN channel layer 12 is formed on the buffer layer 11. The AlGaN electron supply layer 13 is formed on the channel layer. The source electrode 1 and the drain electrode 3, in which the ohmic contact is secured, are formed on the electron supply layer. The gate electrode 2, in which the Schottky contact is secured, and the electron supply layer 13 are provided between the source electrode 1and the drain electrode 3. The insulating film is provided between the gate electrode 2 and the drain electrode 3, and the electric-field control electrode 5 is provided on the insulating film. The insulating film is formed by the SiO₂ film on the gate electrode side, and the insulating film is formed by the SiN film on the drain electrode side.

In Example 7, the insulating film has the structure in which the SiN film effective at the collapse suppression is provided on the drain electrode side while the SiO₂ film effective at the breakdown voltage improvement is provided on the gate electrode side. The collapse suppression can also be possible by the electric-field control electrode. Particularly the collapse suppression can further be achieved by controlling the electric-field control electrode independently of the gate electrode. Further, the decrease in gain can effectively be suppressed by fixing the electric-field control electrode at the predetermined potential. Therefore, in the structure of Example 7, the field-effect transistor having the high gate breakdown voltage, the low collapse influence, and the excellent high-frequency characteristics can be realized. In the structure of Example 7, the SiO₂ film is formed on the gate electrode side. However, it is possible that any film effective at the gate breakdown voltage improvement is provided on the gate electrode side. It is preferable that the insulating film contains no nitrogen is provided on the gate electrode side. In Example 7, the SiN film is provided on the drain electrode side. However, it is possible that the SiON film and the like are provided on the drain electrode side. In this case, when compared with the SiN film, the film thickness of the SiON film can be increased, so that the SiON film is effective in improving the gain.

EXAMPLE 8

Figure 8:
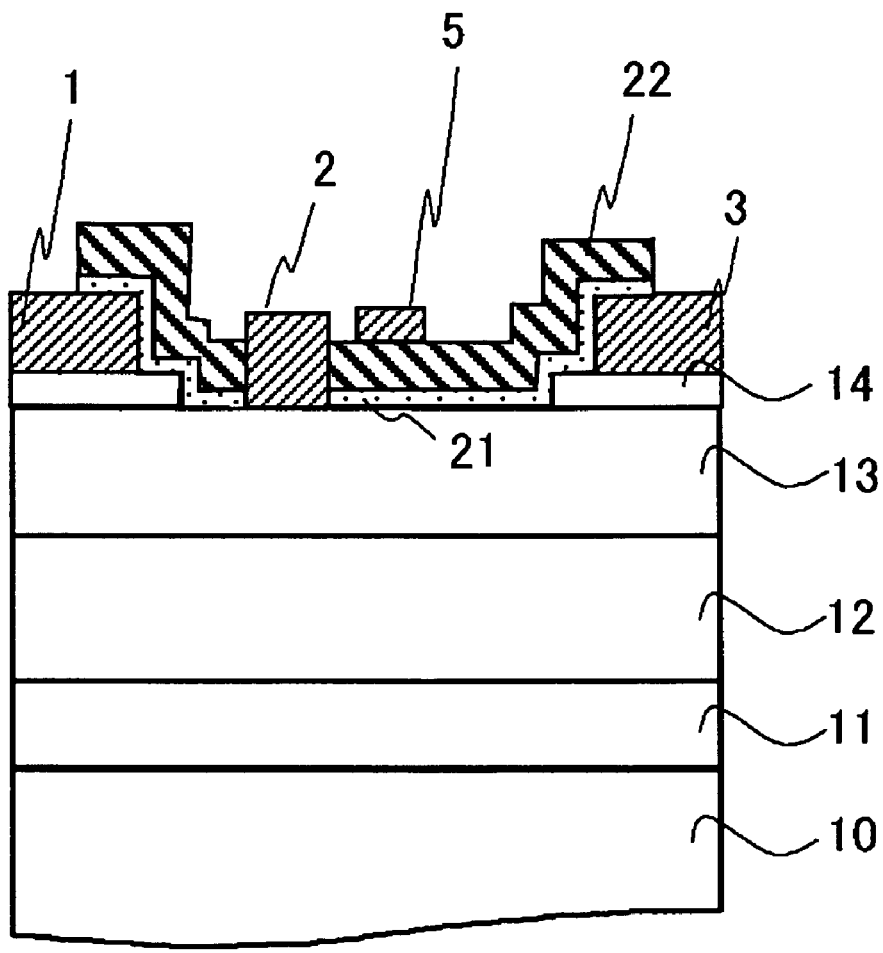
FIG. 8 is a view showing a transistor structure according to Example.

Example 8 is an example of HJFET in which the wide recess structure is adopted. Referring to FIG. 8, Example 8 will be described below.

HJFET is formed on the substrate 10 made of SiC or the like. The source electrode 1 and the drain electrode 3 are formed on GaN contact layers 14, respectively. The buffer layer 11 including the semiconductor layer is formed on the substrate 10. The GaN channel layer 12 is formed on the buffer layer 11. The AlGaN electron supply layer 13 is formed on the channel layer. The GaN contact layers 14 are located on the electron supply layer 13. The source electrode 1 and the drain electrode 3, in which the ohmic contact is secured, are formed while being in contact with the contact layers 14, respectively. The gate electrode 2, in which the Schottky contact is secured, is provided by removing a part of the contact layer 14 located between the source electrode 1 and the drain electrode 3. The gate electrode 2 is in contact with the exposed AlGaN electron supply layer 13. The surface of the electron supply layer 13 is covered with the SiN film 21, and the SiO$_2$ film 22 is further provided on the SiN film 21. The electric-field control electrode 5 is provided on the SiO$_2$ film 22 while located between the gate electrode 2 and the drain electrode 3.

Example 8 employs the structure in which the contact layer is added to Example 1. In addition to the effects described in Example 1, contact resistance can further be reduced.

Because an electric field distribution is changed in the drain side end portion of the gate electrode 2 by adopting the wide recess structure, the further excellent electric field relaxation effect is obtained by combining with the function of the electric-field control electrode 5.

In Example 8, it is preferable that the size of the electric-field control electrode is not lower than 0.3 µm. It is more preferable that the size of the electric-field control electrode is not lower than 0.5 µm. It is preferable that the end of the electric-field control electrode is located at the position where the end of the electric-field control electrode does not overlap the contact layer. It is more preferable that the size of the electric-field control electrode is formed not more than 70% of the distance between the gate electrode and the contact layer.

In Example 8, the multilayered film of the SiN film 21 and the SiO$_2$ film 22 is used as the insulating film provided on the electron supply layer 13. However, as described in Example 2 and Example 6, the same effects are obtained, in the case where the insulating film is formed by the three-layer structure, or in the case where the gate electrode side differs from the drain electrode side in the film structure.

EXAMPLE 9

Figure 9:
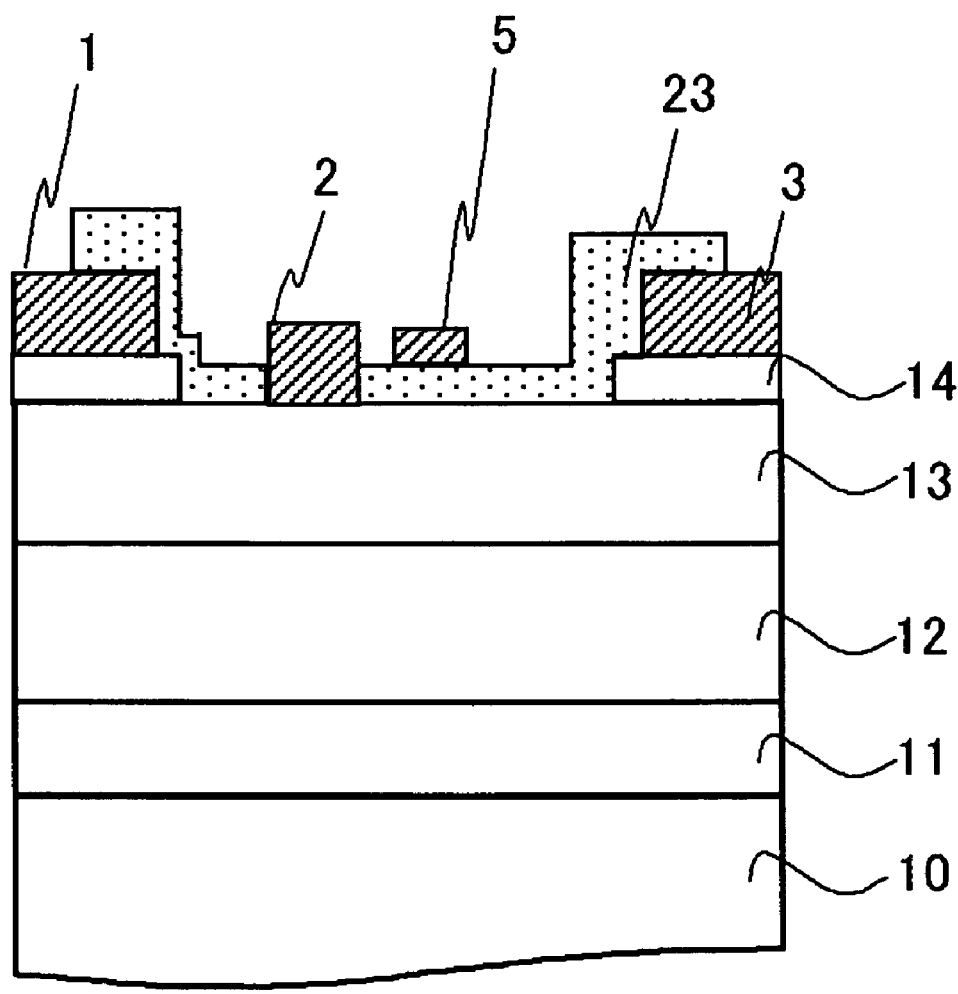
FIG. 9 is a view showing a transistor structure according to Example.

Example 9 is an example of HJFET in which the wide recess structure is adopted. Referring to FIG. 9, Example 9 will be described below.

HJFET is formed on the substrate 10 made of SiC or the like. The source electrode 1 and the drain electrode 3 are formed on the GaN contact layers 14, respectively. The buffer layer 11 including the semiconductor layer is formed on the substrate 10. The GaN channel layer 12 is formed on the buffer layer 11. The AlGaN electron supply layer 13 is formed on the channel layer. The contact layers 14 are located on the electron supply layer 13. The source electrode 1 and the drain electrode 3, in which the ohmic contact is secured, are formed while being in contact with the contact layers 14, respectively. The gate electrode 2, in which the Schottky contact is secured, is provided by removing a part of the contact layer 14 between the source electrode 1 and the drain electrode 3. The gate electrode 2 is in contact with the exposed AlGaN electron supply layer 13. The element surface is covered with the SiON film 23. The electric-field control electrode 5 is provided on the SiON film 23 while located between the gate electrode 2 and the drain electrode 3.

Example 9 employs the structure in which the contact layer is added to Example 4. In addition to the effects described in Example 4, the contact resistance can further be reduced.

Because the electric field distribution is changed in the drain side end portion of the gate electrode 2 by adopting the wide recess structure, the further excellent electric field relaxation effect is obtained by combining with the function of the electric-field control electrode 5.

In the SiON film of Example 9, it is preferable that the refractive index ranges from 1.65 to 2.05.

In Example 9, it is preferable that the size of the electric-field control electrode is not lower than 0.3 µm. It is more preferable that the size of the electric-field control electrode is not lower than 0.5 µm. It is preferable that the end of the electric-field control electrode is located at the position where the end of the electric-field control electrode does not overlap the contact layer. It is more preferable that the size of the electric-field control electrode is formed not more than 70% of the distance between the gate electrode and the contact layer.

In Example 9, the insulating film is formed by the SiON film 23. However, as described in Example 3, it is also possible that the insulating film is formed by the SiN film. In this case, the control of making the film thinner is required, and it is preferable that the film is set at the thicknesses not more than 150 nm. As described in Example 7, it is also possible that the gate electrode side differs from the drain electrode side in the structure of the insulating film.

EXAMPLE 10

Figure 10:
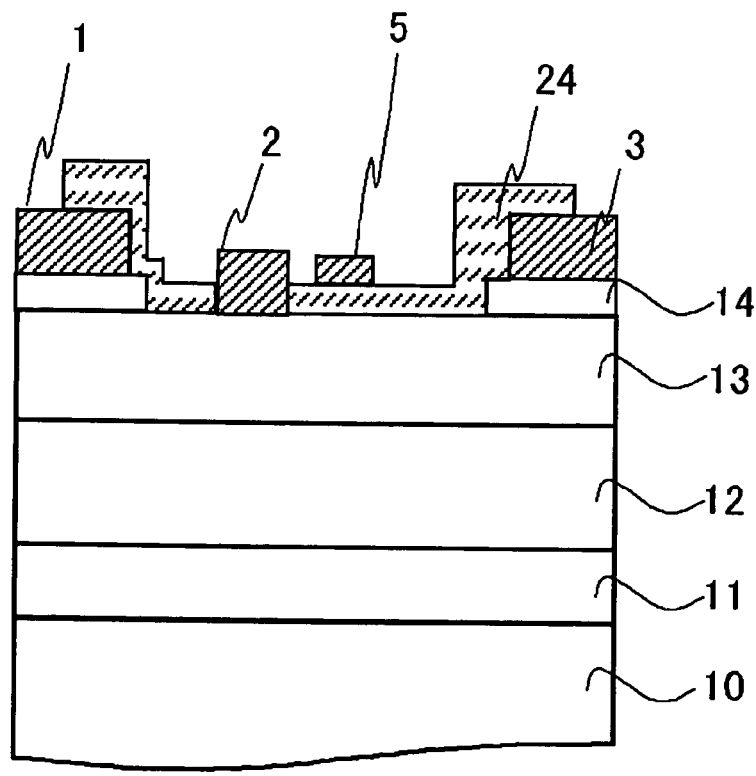
FIG. 10 is a view showing a transistor structure according to Example.

Example 10 employs the structure in which the contact layer 14 is added to Example 5. In addition to the effects described in Example 5, the contact resistance can further be reduced. Referring to FIG. 10, Example 10 will be described below.

Because the electric field distribution is changed in the drain side end portion of the gate electrode 2 by adopting the wide recess structure, the further excellent electric field relaxation effect is obtained by combining with the function of the electric-field control electrode 5.

In Example 10, it is preferable that the size of the electric-field control electrode is not lower than 0.3 µm. It is more preferable that the size of the electric-field control electrode is not lower than 0.5 µm. It is preferable that the end of the electric-field control electrode is located at the position where the end of the electric-field control electrode does not overlap the contact layer. It is more preferable that the size of the electric-field control electrode is formed not more than 70% of the distance between the gate electrode and the contact layer.

EXAMPLE 11

Figure 11:
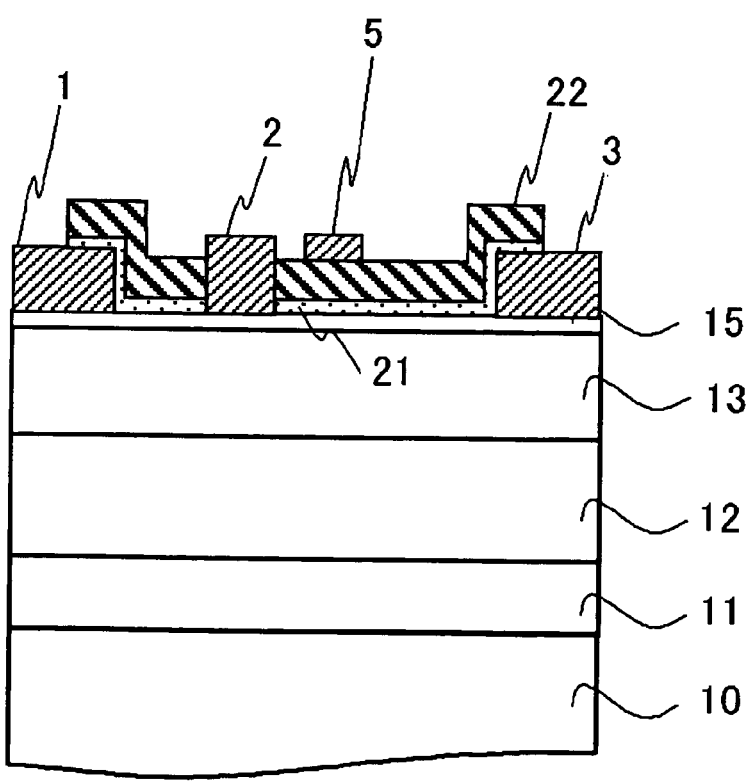
FIG. 11 is a view showing a transistor structure according to Example.

FIG. 11 shows a sectional structure of HJFET according to Example 11. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the channel layer, and a GaN cap layer 15 is formed on the AlGaN electron supply layer 13. The source electrode 1 and the drain electrode 3, in which the ohmic contact is secured, are located on the GaN cap layer. The gate electrode 2, in which the Schottky contact is secured, and the electric-field control electrode 5 are provided between the source electrode 1 and the drain electrode 3. The surface of the GaN cap layer 15 is covered with the SiN film 21, and the SiO$_2$ film 22 is further provided on the SiN film 21. The SiN film 21 and the SiO$_2$ film 22 are provided immediately below the electric-field control electrode 5.

Example 11 employs the structure in which the GaN cap layer is added to the uppermost portion of the semiconductor in Example 1, and Example 11 can realize the higher gate breakdown voltage by increasing the effective Schottky height. Namely, the excellent gate breakdown voltage is obtained by the synergistic action among the electric-field control electrode, the multilayered film immediately below the electric-field control electrode, and the GaN cap layer according to Example 11.

In Example 11, it is preferable that the size of the electric-field control electrode is not lower than 0.3 µm. It is more preferable that the size of the electric-field control electrode is not lower than 0.5 µm. It is preferable that the end of the electric-field control electrode is located at the position where the end of the electric-field control electrode does not overlap the drain electrode. It is more preferable that the size of the electric-field control electrode is formed not more than 70% of the distance between the gate electrode and the drain electrode.

In Example 11, the multilayered film of the SiN film 21 and the SiO$_2$ film 22 is used as the insulating film provided on the electron supply layer 13. However, as described in Example 2 and Example 6, it is also possible that the insulating film is formed by the three-layer structure, or it is possible that the gate electrode side differs from the drain electrode side in the structure of the insulating film. In this case, the same effects are also obtained.

EXAMPLE 12

Figure 12:
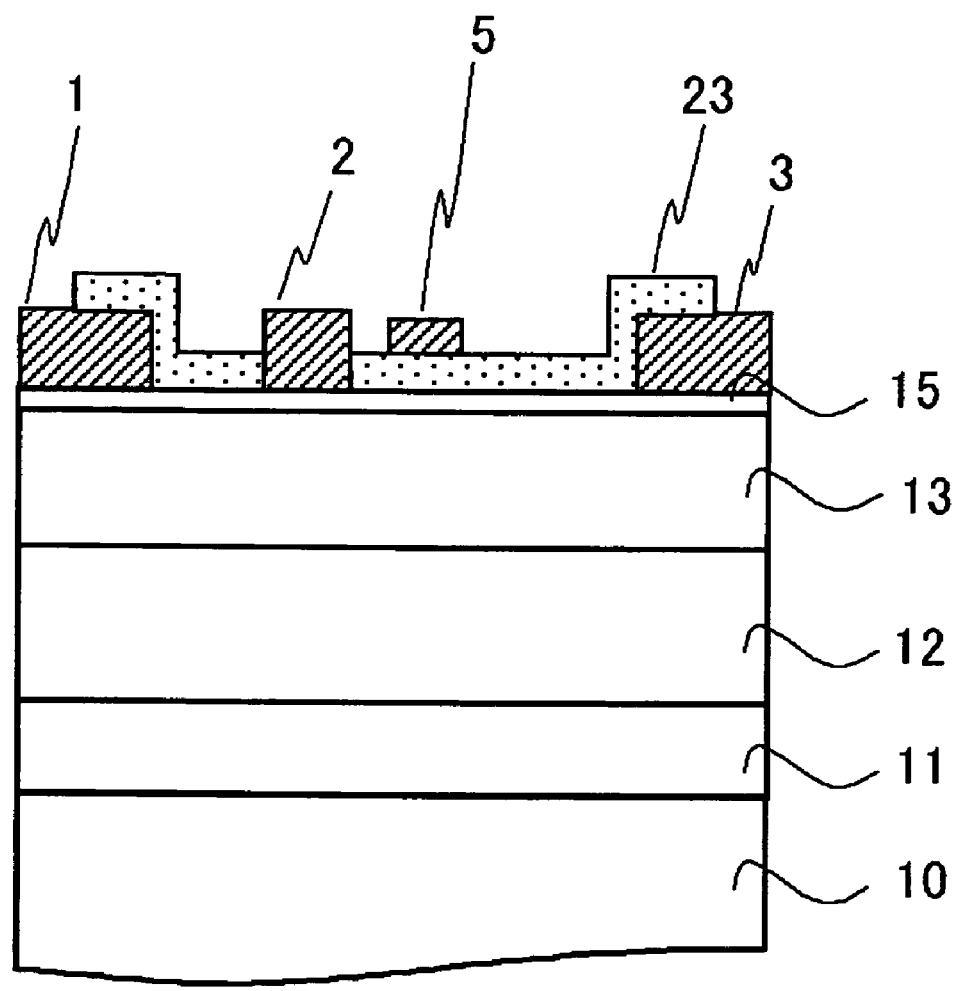
FIG. 12 is a view showing a transistor structure according to Example.

FIG. 12 shows a sectional structure of HJFET according to Example 12. As with HJFET shown in FIG. 11, the GaN cap layer 15 is formed on the AlGaN electron supply layer 13 in HJFET of Example 12. The source electrode 1 and the drain electrode 3, in which the ohmic contact is secured, are formed on the GaN cap layer. The gate electrode 2, in which the Schottky contact is secured, and the electric-field control electrode 5 are provided between the source electrode 1 and the drain electrode 3. The surface of the GaN cap layer 15 is covered with the SiON film 23, and the SiON film 23 is provided immediately below the electric-field control electrode 5.

Example 12 employs the structure in which the GaN cap layer is added to the uppermost portion of the semiconductor in Example 4, and Example 12 can realize the higher gate breakdown voltage by increasing the effective Schottky height. Namely, the excellent gate breakdown voltage is obtained by the synergistic action among the electric-field control electrode, the multilayered film immediately below the electric-field control electrode, and the GaN cap layer according to Example 12.

In the SiON film of Example 12, it is preferable that the refractive index ranges from 1.65 to 2.05.

In Example 12, it is preferable that the size of the electric-field control electrode is not lower than 0.3 µm. It is more preferable that the size of the electric-field control electrode is not lower than 0.5 µm. It is preferable that the end of the electric-field control electrode is located at the position where the end of the electric-field control electrode does not overlap the drain electrode. It is more preferable that the size of the electric-field control electrode is formed not more than 70% of the distance between the gate electrode and the drain electrode.

In Example 12, the insulating film is formed by the SiON film 23. However, as described in Example 3, it is also possible that the insulating film is formed by the SiN film. In this case, the control of making the film thinner is required when compared with the SiON film. Preferably it is necessary that the SiN film is set at the thicknesses not more than 150 nm. As described in Example 7, even if the gate electrode side differs from the drain electrode side in the structure of the insulating film, the effect obtained by providing the cap layer is also produced.

EXAMPLE 13

Figure 13:
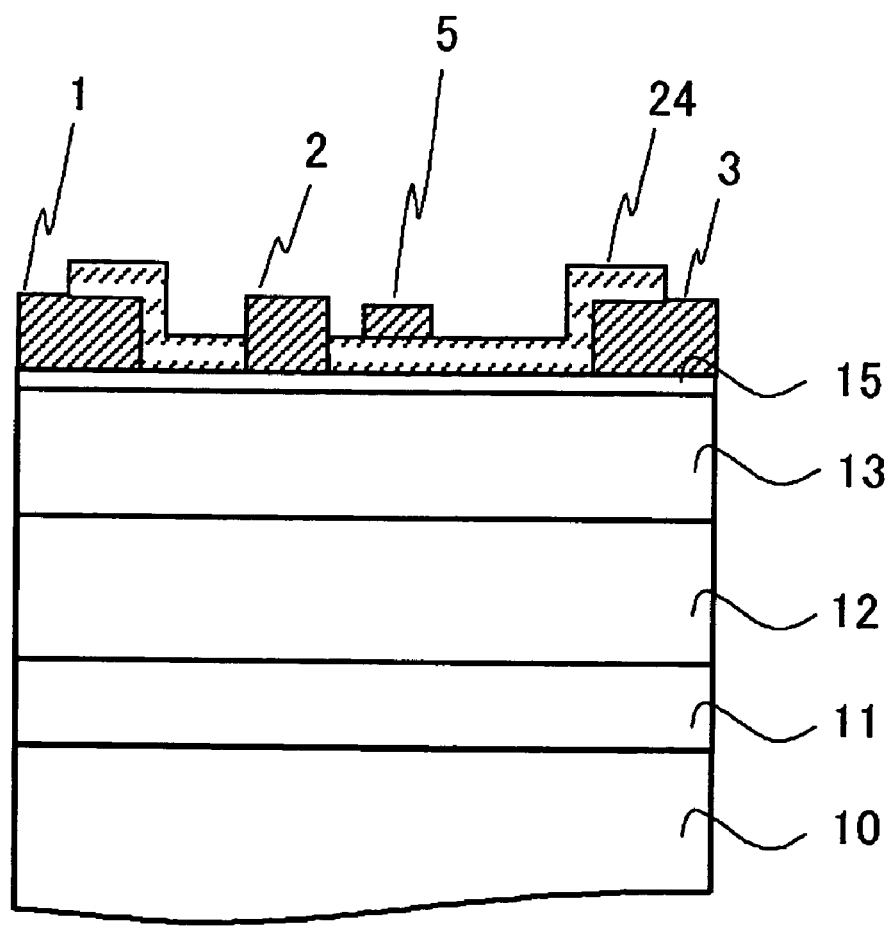
FIG. 13 is a view showing a transistor structure according to Example.

FIG. 13 shows a sectional structure of HJFET according to Example 13. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the channel layer, and the GaN cap layer 15 is formed on the AlGaN electron supply layer 13. The source electrode 1 and the drain electrode 3, in which the ohmic contact is secured, are formed on the GaN cap layer. The gate electrode 2, in which the Schottky contact is secured, and the electric-field control electrode 5 are provided between the source electrode 1 and the drain electrode 3. The surface of the GaN cap layer 15 is covered with the SiOC film 24, and the SiOC film 24 is provided immediately below the electric-field control electrode 5.

Example 13 employs the structure in which the GaN cap layer is added to the uppermost portion of the semiconductor in Example 5, and Example 13 can realize the higher gate breakdown voltage by increasing the effective Schottky height. Namely, the excellent gate breakdown voltage is obtained by the synergistic action among the electric-field control electrode, the multilayered film immediately below the electric-field control electrode, and the GaN cap layer according to Example 13.

In Example 13, it is preferable that the size of the electric-field control electrode is not lower than 0.3 µm. It is more preferable that the size of the electric-field control electrode is not lower than 0.5 µm. It is preferable that the end of the electric-field control electrode is located at the position where the end of the electric-field control electrode does not overlap the drain electrode. It is more preferable that the size of the electric-field control electrode is formed not more than 70% of the distance between the gate electrode and the drain electrode.

EXAMPLE 14

Figure 14:
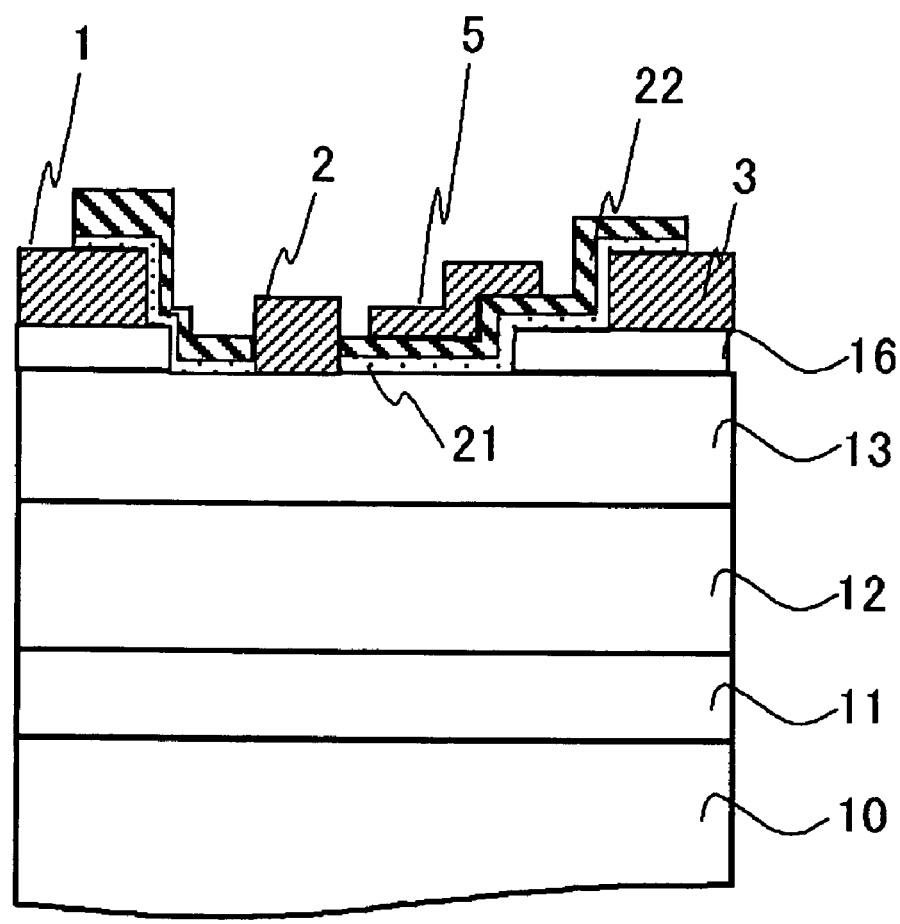
FIG. 14 is a view showing a transistor structure according to Example.

FIG. 14 shows a sectional structure of HJFET according to Example 14. Example 14 employs the structure, in which the contact layer of Example 8 is made of undoped AlGaN and the electric-field control electrode overlaps the contact layer.

HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the channel layer. Undoped AlGaN layers 16 are formed on the AlGaN electron supply layer 13. The source electrode 1 and the drain electrode 3, in which the ohmic contact is secured, are formed while being in contact with the undoped AlGaN layers 16, respectively. The gate electrode 2, in which the Schottky contact is secured, is provided by removing a part of the undoped AlGaN layer located between the source electrode 1 and the drain electrode 3. The gate electrode 2 is in contact with the exposed AlGaN electron supply layer 13. The element surface is covered with the SiN film 21, and the SiO$_2$ film 22 is further provided on the SiN film 21. Further, the electric-field control electrode 5 is provided on the SiO$_2$ film. As shown in FIG. 14, the electric-field control electrode 5 may overlap the undoped AlGaN layers 16.

In Example 14, since the contact layer is formed by the undoped AlGaN layer, the electric field concentration is relaxed between the electric-field control electrode and the contact layer. Therefore, even if the electric-field control electrode overlaps the contact layer, the gate breakdown voltage is not decreased, which allows the electric-field control electrode to control almost all of the surface charges over the surface of the AlGaN electron supply layer. As a result, there is generated the effect that the collapse is further effectively suppressed.

In Example 14, since the undoped AlGaN layers 16 is used as the contact layer, the effect that the electric field concentration can be suppressed near the drain electrode is also obtained. In the case where the electric-field control electrode 5 extends toward the drain side, the electric field concentration is relaxed near the gate electrode 2. However, the problem of the electric field concentration near the drain electrode 3 becomes obvious. According to the structure of Example 14, the undoped AlGaN layers 16 is positioned between the drain electrode 3 and the electron supply layer 13, so that the electric field concentration near the drain electrode 3 can effectively be relaxed.

EXAMPLE 15

Example 15 employs the structure, in which the contact layer of Example 9 is made of the undoped AlGaN and the electric-field control electrode overlaps the contact layer.

Figure 15:
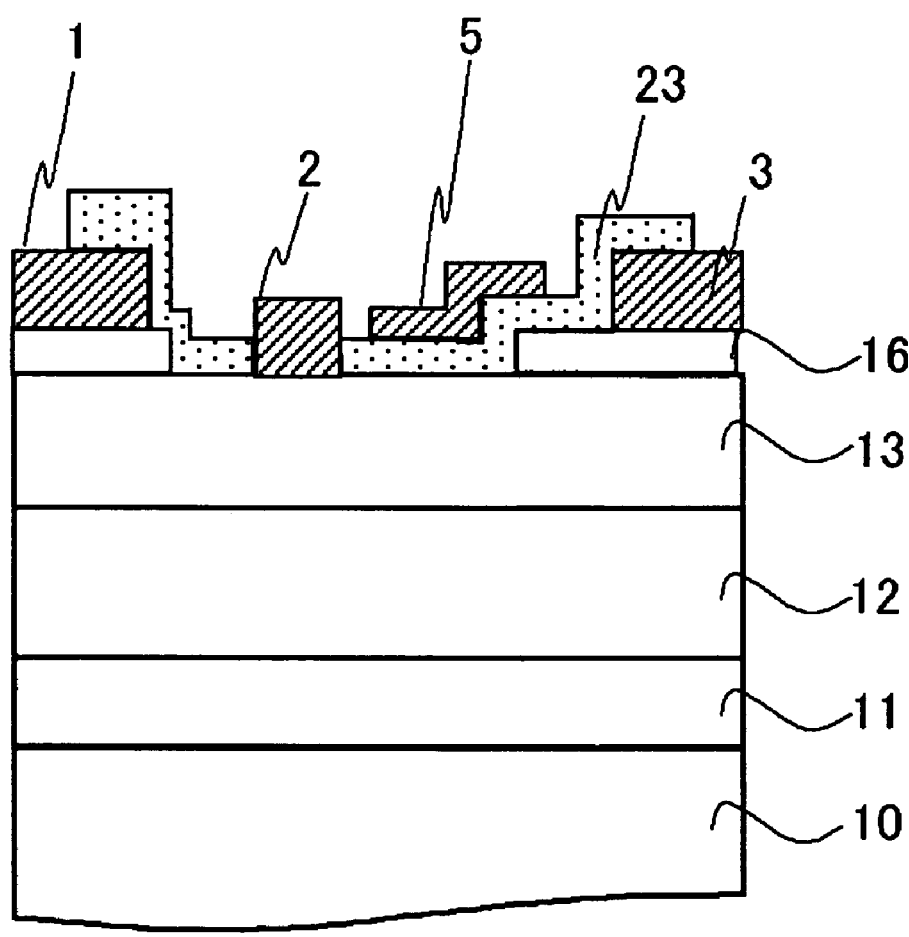
FIG. 15 is a view showing a transistor structure according to Example.

FIG. 15 shows a sectional structure of HJFET according to Example 15. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the channel layer. The undoped AlGaN layers 16 are formed on the AlGaN electron supply layer 13. The source electrode 1 and the drain electrode 3, in which the ohmic contact is secured, are formed while being in contact with the undoped AlGaN layers 16, respectively. The gate electrode 2, in which the Schottky contact is secured, is provided by removing a part of the undoped AlGaN layer located between the source electrode 1 and the drain electrode 3. The gate electrode 2 is in contact with the exposed AlGaN electron supply layer 13. The element surface is covered with the SiON film 23. The electric-field control electrode 5 is provided on the SiON film 23 while located between the gate electrode 2 and the drain electrode 3. The electric-field control electrode 5 may overlap the undoped AlGaN layers 16.

In Example 15, since the contact layer is formed by the undoped AlGaN layer, the electric field concentration is relaxed between the electric-field control electrode and the contact layer. Therefore, even if the electric-field control electrode overlaps the contact layer, the gate breakdown voltage is not decreased, which allows the electric-field control electrode to control almost all of the surface charges over the surface of the AlGaN electron supply layer. As a result, there is generated the effect that the collapse is further effectively suppressed.

In Example 15, since the undoped AlGaN layer 16 is used as the contact layer, the effect that the electric field concentration can be suppressed near the drain electrode is also obtained. In the case where the electric-field control electrode 5 extends toward the drain side, the electric field concentration is relaxed near the gate electrode 2. However, the problem of the electric field concentration near the drain electrode 3 becomes obvious. According to the structure of Example 15, the undoped AlGaN layer 16 is positioned between the drain electrode 3 and the electron supply layer 13, so that the electric field concentration near the drain electrode 3 can effectively be relaxed.

EXAMPLE 16

Example 16 employs the structure, in which the contact layer of Example 10 is made of undoped AlGaN and the electric-field control electrode overlaps the contact layer.

Figure 16:
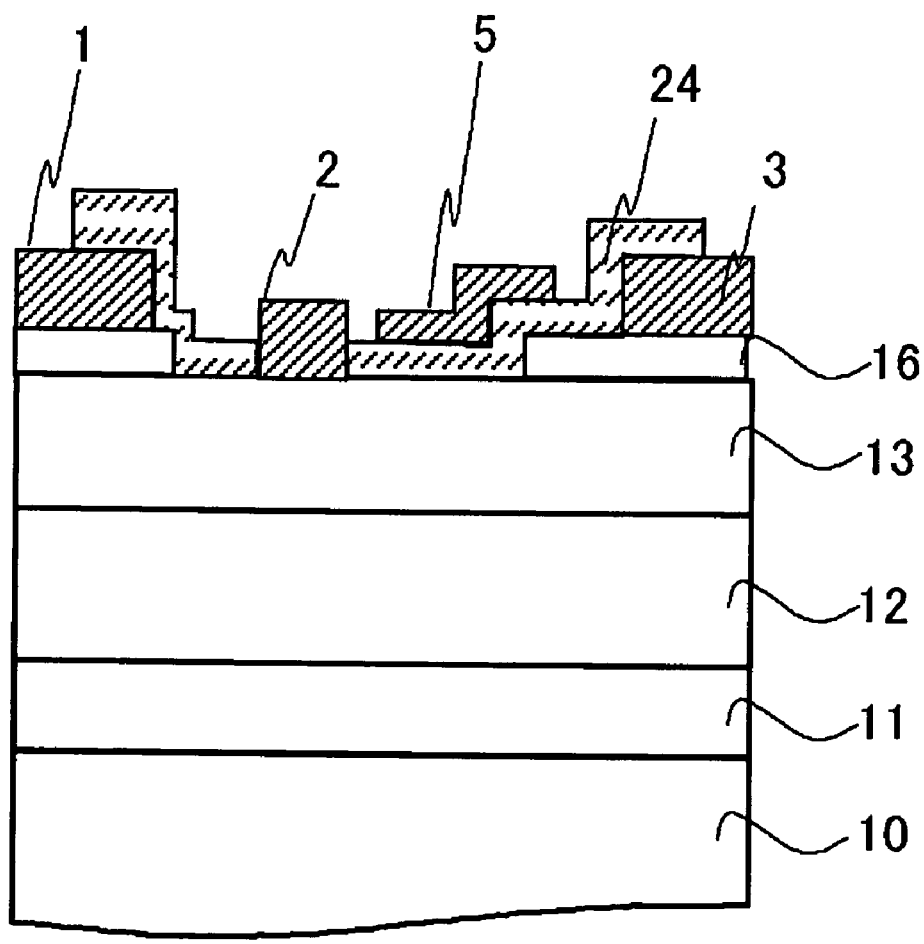
FIG. 16 is a view showing a transistor structure according to Example.
Figure 17:
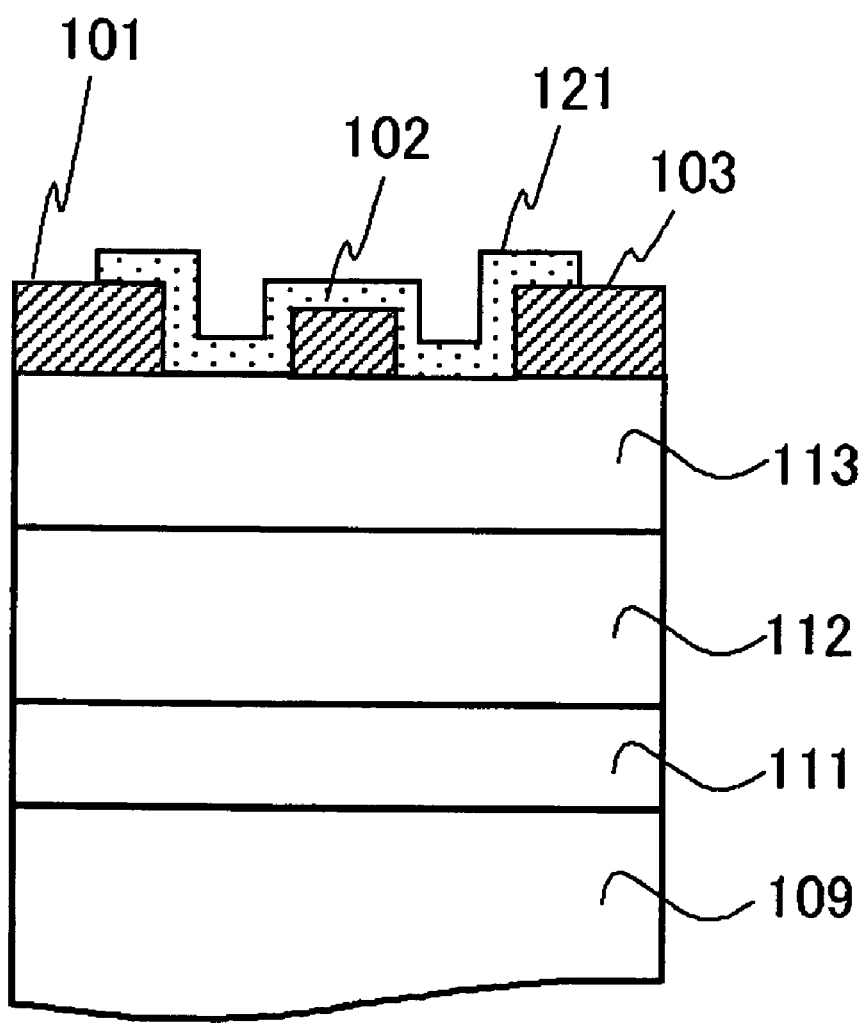
FIG. 17 is a view showing a structure of a conventional transistor.

FIG. 16 shows a sectional structure of HJFET according to Example 16. HJFET is formed on the substrate 10 made of SiC or the like. The buffer layer 11 including the semiconductor layer is formed on the substrate 10. The GaN channel layer 12 is formed on the buffer layer 11. The AlGaN electron supply layer 13 is formed on the channel layer. The undoped AlGaN layers 16 are formed on the AlGaN electron supply layer 13. The source electrode 1 and the drain electrode 3, in which the ohmic contact is secured, are formed while being in contact with the undoped AlGaN layers 16, respectively. The gate electrode 2, in which the Schottky contact is secured, is provided by removing a part of the undoped AlGaN layer located between the source electrode 1 and the drain electrode 3. The gate electrode 2 is in contact with the exposed AlGaN electron supply layer 13. The element surface is covered with the SiOC film 24, and the electric-field control electrode 5 is provided on the SiOC film. The electric-field control electrode 5 may overlap the undoped AlGaN layers 16.

In Example 16, since the contact layer is formed by the undoped AlGaN layer, the electric field concentration is relaxed between the electric-field control electrode and the contact layer. Therefore, even if the electric-field control electrode overlaps the contact layer, the gate breakdown voltage is not decreased, which allows the electric-field control electrode to control almost all of the surface charges over the surface of the AlGaN electron supply layer. As a result, there is generated the effect that the collapse is further effectively suppressed.

In Example 16, since the undoped AlGaN layers 16 are used as the contact layer, the effect that the electric field concentration can be suppressed near the drain electrode is also obtained. In the case where the electric-field control electrode 5 extends toward the drain side, the electric field concentration is relaxed near the gate electrode 2. However, the problem of the electric field concentration near the drain electrode 3 becomes obvious. According to the structure of Example 16, the undoped AlGaN layer 16 is positioned between the drain electrode 3 and the electron supply layer 13, so that the electric field concentration near the drain electrode 3 can effectively be relaxed.

In Examples 14 to 16, the amount of aluminum content is arbitrarily determined in the undoped AlGaN layers 16 and the AlGaN electron supply layer 13. When the undoped AlGaN layers 16 and the AlGaN electron supply layer 13 have the same aluminum content, because the undoped AlGaN layers 16 and the AlGaN electron supply layer 13 are made of the same material, the low resistance can be obtained. When the undoped AlGaN layers 16 are higher than the AlGaN electron supply layer 13 located beneath the undoped AlGaN layers 16 in the aluminum content, the carrier is generated in the interlayer between the undoped AlGaN layers 16 and the AlGaN electron supply layer 13 by the piezo effect, which allows the low resistance to be realized.

Thus, the invention has been described based on Examples. Examples are illustrative only, and it should be understood for the skilled in the art that various modifications can be made in combination of each constituent element and each process, and such modifications are within the scope of the invention.

For example, in the above-described Examples, SiC is used as the substrate material. However, it is also possible that a substrate using other kind of materials such as sapphire and the Group III semiconductor substrate such as GaN and AlGaN are used as the substrate material.

The semiconductor layer structure below the gate is not limited to the illustrations, but the various modes can be adopted. For example, it is possible to form the structure in which the AlGaN electron supply layers 13 are provided in not only the upper portion of the GaN channel layer 12 but also the lower portion of the GaN channel layer 12.

The low-dielectric-constant film is not limited to those illustrated in Examples, but various materials can be used as the low-dielectric-constant film.

In the above-described Examples, it is possible to adopt the so-called gate recess structure, in which a part of the lower portion of the gate electrode 2 is embedded in the AlGaN electron supply layer 13. Therefore, the excellent gate breakdown voltage is obtained by combining with the action of the electric-field control electrode.

What is claimed is:

1. A field-effect transistor comprising:
  a Group III nitride semiconductor layer structure which includes a heterojunction;
  a source electrode and a drain electrode which are formed on the semiconductor layer structure while being separated from each other; and
  a gate electrode which is arranged between said source electrode and said drain electrode,
  wherein, an electric-field control electrode is formed through an insulating film in an upper portion of said Group III nitride semiconductor layer structure, said electric-field control electrode being located in an area between said gate electrode and said drain electrode, and
  said insulating film is a multilayered film including a first insulating film and a second insulating film, said first insulating film containing silicon and nitrogen as constituent elements, said second insulating film having a dielectric constant lower than that of said first insulating film.

2. A field-effect transistor according to claim 1, wherein, said first insulating film is formed while being in contact with a surface of said Group III nitride semiconductor layer structure, and said second insulating film is laminated on said first insulating film.

3. A field-effect transistor according to claim 1, wherein, said first insulating film is not more than 150 nm.

4. A field-effect transistor according to claim 1, wherein, a dielectric constant of said second insulating film is not more than 3.5.

5. A field-effect transistor according to claim 1, wherein, further comprising a third insulating film which contains silicon and nitrogen as constituent elements, said third insulating film being provided on said second insulating film.

6. A field-effect transistor according to claim 1, wherein, said insulating film including the multilayered film is formed while being separated from said gate electrode, the multilayered film having said first insulating film and said second insulating film, and said second insulating film is provided between said insulating film and said gate electrode.

7. A field-effect transistor according to claim 1, wherein, said Group III nitride semiconductor layer structure includes a channel layer made of $In_xGa_{1-x}N$ ($0 \leq x \leq 1$) and an electron supply layer made of $Al_yGa_{1-y}N$ ($0 < y \leq 1$).

8. A field-effect transistor according to claim 1, wherein, contact layers are arranged between said source electrode and a surface of said Group III nitride semiconductor layer structure and between said drain electrode and a surface of said Group III nitride semiconductor layer structure, respectively.

9. A field-effect transistor according to claim 8, wherein, said contact layer is formed by an undoped AlGaN layer.

10. A field-effect transistor according to claim 8, wherein, said electric-field control electrode extends to an upper portion of said contact layer.

11. A field-effect transistor according to claim 1, wherein, said Group III nitride semiconductor layer structure has a structure in which the channel layer made of $In_xGa_{1-x}N$ ($0 \leq x \leq 1$), the electron supply layer made of $Al_yGa_{1-y}N$ ($0 < y \leq 1$), and a cap layer made of GaN are sequentially laminated.

12. A field-effect transistor according to claim 1, wherein, said electric-field control electrode can be controlled independently of said gate electrode.

13. A field-effect transistor according to claim 1, wherein, said electric-field control electrode is fixed at a predetermined potential.

14. A field-effect transistor according to claim 13, wherein, said predetermined potential is any one of the potentials of said source electrode, said drain electrode, and said gate electrode.

15. A field-effect transistor comprising:
  a Group III nitride semiconductor layer structure which includes a heterojunction;
  a source electrode and a drain electrode which are formed on the semiconductor layer structure while being separated from each other; and
  a gate electrode which is arranged between said source electrode and said drain electrode,
  wherein, an electric-field control electrode is formed through an insulating film in an upper portion of said Group III nitride semiconductor layer structure, said electric-field control electrode being located in an area between said gate electrode and said drain electrode, and
  said insulating film contains silicon and nitrogen as constituent elements.

16. A field-effect transistor according to claim 15, wherein, said insulating film further contains oxygen and/or carbon as a constituent element.

17. A field-effect transistor comprising:
  a Group III nitride semiconductor layer structure which includes a heterojunction;
  a source electrode and a drain electrode which are formed on the semiconductor layer structure while being separated from each other; and
  a gate electrode which is arranged between said source electrode and said drain electrode,
  wherein, an electric-field control electrode is formed through an insulating film in an upper portion of said Group III nitride semiconductor layer structure, said electric-field control electrode being located in an area between said gate electrode and said drain electrode, and said insulating film is an insulating film which contains silicon, oxygen, and carbon as constituent elements.

18. A field-effect transistor comprising:

a Group III nitride semiconductor layer structure which includes a heterojunction;

a source electrode and a drain electrode which are formed on the semiconductor layer structure while being separated from each other; and a gate electrode which is arranged between said source electrode and said drain electrode, wherein, an electric-field control electrode is formed through an insulating film in an upper portion of said Group III nitride semiconductor layer structure, said electric-field control electrode being located in an area between said gate electrode and said drain electrode, said insulating film on said gate electrode side is formed by an insulating material which does not contain nitrogen as a constituent element, and said insulating film on said drain electrode side is formed by an insulating material which contains silicon and nitrogen as constituent elements.

19. A field-effect transistor according to claim 18, wherein, the insulating material provided on said drain electrode side, of said insulating film further contains oxygen and/or carbon as a constituent element in addition to silicon and nitrogen.

20. A field-effect transistor comprising:

a Group III nitride semiconductor layer structure which includes a heterojunction;

a source electrode and a drain electrode which are formed on the semiconductor layer structure while being separated from each other; and a gate electrode which is arranged between said source electrode and said drain electrode, wherein, an electric-field control electrode is formed through an insulating film in an upper portion of said Group III nitride semiconductor layer structure, said electric-field control electrode being located in an area between said gate electrode and said drain electrode, and a dielectric constant of said insulating film is not more than 3.5.

* * * * *